US012803139B2

(12) United States Patent
Yoshida et al.

(10) Patent No.: US 12,803,139 B2
(45) Date of Patent: Nov. 17, 2026

(54) PHASE SHIFTER AND ANTENNA DEVICE

(71) Applicant: NEC Corporation, Tokyo (JP)

(72) Inventors: Kohei Yoshida, Tokyo (JP); Ryota Nihei, Tokyo (JP); Fujio Okumura, Kanagawa (JP)

(73) Assignee: NEC CORPORATION, Tokyo (JP)

( * ) Notice: Subject to any disclaimer, the term of this patent is extended or adjusted under 35 U.S.C. 154(b) by 70 days.

(21) Appl. No.: 18/991,997

(22) Filed: Dec. 23, 2024

(65) Prior Publication Data

US 2025/0260162 A1 Aug. 14, 2025

(30) Foreign Application Priority Data

Feb. 9, 2024 (JP) ................................ 2024-018567

(51) Int. Cl.
*H01P 1/18* (2006.01)
*H01Q 3/36* (2006.01)
*H03H 7/20* (2006.01)

(52) U.S. Cl.
CPC ................ *H01P 1/18* (2013.01); *H01P 1/181* (2013.01); *H01P 1/184* (2013.01); *H01Q 3/36* (2013.01); *H03H 7/20* (2013.01)

(58) Field of Classification Search
CPC . H01P 1/18; H01P 1/181; H01P 1/184; H03H 7/20; H01Q 3/36
See application file for complete search history.

(56) References Cited

U.S. PATENT DOCUMENTS

2022/0137209 A1* 5/2022 Alidio .................. G01S 13/931
342/75

FOREIGN PATENT DOCUMENTS

CN 113314346 * 8/2021 ............... H01G 7/00
JP 2019-029722 A 2/2019

* cited by examiner

*Primary Examiner* — Samuel S Outten

(57) ABSTRACT

A phase shifter including a 90 degree hybrid circuit having two reflection ends, a varactor having a variable capacitance layer made of vanadium dioxide and disposed at the reflection end of the 90 degree hybrid circuit, and a stub connected to the reflection end of the 90 degree hybrid circuit via the varactor.

9 Claims, 22 Drawing Sheets

130

| PHASE SHIFT AMOUNT | CONDUCTOR PATTERN |
|---|---|
| 0 | $P_{c1}$ |
| 1/4 λ | $P_{c2}$ |
| 1/2 λ | $P_{c3}$ |
| … | … |

PHASE SHIFTER AND ANTENNA DEVICE

This application is based upon and claims the benefit of priority from Japanese Patent Application No. 2024 018567, filed on Feb. 9, 2024, the disclosure of which is incorporated herein in its entirety by reference.

TECHNICAL FIELD

The present disclosure relates to a phase shifter and an antenna device.

BACKGROUND ART

For mobile communication after the fifth-generation mobile communication, an antenna device compatible with radio waves in a high frequency band has been developed. For example, examples of such an antenna device include a phased array antenna configured by a plurality of antenna elements. The phased array antenna can form a beam having a desired directivity by changing an excitation phase of an antenna element using a phase shifter mounted on a pre-stage of the antenna element. For example, since a phase shift range up to 360 degrees can be covered by using a switched line phase shifter, in such a way that a large scanning angle can be achieved. However, it is difficult to incorporate such a phase shifter in a small antenna device having a plurality of patch antennas.

PTL 1 (Japanese Patent Application Laid-Open No. 2019-029722) discloses a variable phase shifter. The variable phase shifter of PTL 1 includes a hybrid circuit, a pair of switches, a pair of first variable reactance elements, a pair of stubs, and a second variable reactance element. The hybrid circuit has a first port, a second port, a third port, and a fourth port. The hybrid circuit outputs a signal input from the first port to the second port and the third port with a phase difference of 90 degrees. The hybrid circuit does not output the signal input from the first port to the fourth port. One switch is provided in each of the second port and the third port. One first variable reactance element is connected to each of the pair of switches. One end of the stub is connected to each of the pair of switches. One second variable reactance element is connected to each of the other ends of the first stubs. The switch switches between connection with the first variable reactance element and connection with one end of the first stub.

PTL 1 discloses application of a varactor diode as a first variable reactance element and a second variable reactance element. According to the variable phase shifter of PTL 1, a continuous phase shift change can be achieved by continuously changing the capacitance by applying a reverse voltage to the variable reactance element. However, in the variable phase shifter of PTL 1, it is necessary to finely control the reverse voltage to be applied to the variable reactance element, and it is difficult to obtain a stable phase shift amount.

An object of the present disclosure is to provide a phase shifter and an antenna device capable of achieving continuous phase shift change with a stable phase shift amount.

SUMMARY

A phase shifter according to an aspect of the present disclosure includes a 90 degree hybrid circuit having two reflection ends, a varactor having a variable capacitance layer made of vanadium dioxide and disposed at the reflection end of the 90 degree hybrid circuit, and a stub connected to the reflection end of the 90 degree hybrid circuit via the varactor.

BRIEF DESCRIPTION OF THE DRAWINGS

Exemplary features and advantages of the present invention will become apparent from the following detailed description when taken with the accompanying drawings in which.

EXAMPLE EMBODIMENT

Figure 1:
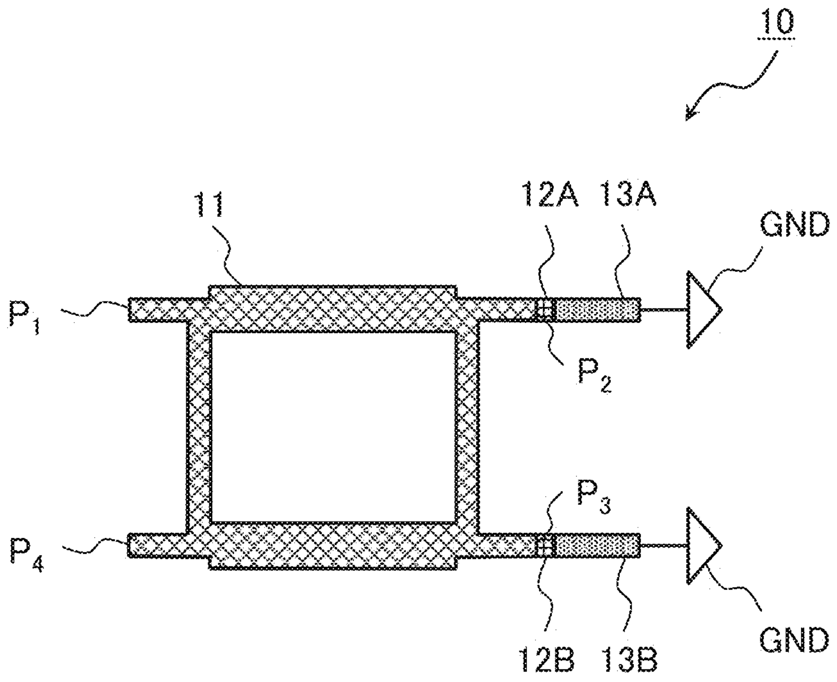
FIG. 1 is a conceptual diagram illustrating an example of a configuration of a phase shifter according to the present disclosure.

Example embodiments of the present invention will be described below with reference to the drawings. In the following example embodiments, technically preferable limitations are imposed to carry out the present invention, but the scope of this invention is not limited to the following description. In all drawings used to describe the following example embodiments, the same reference numerals denote similar parts unless otherwise specified. In addition, in the following example embodiments, a repetitive description of similar configurations or arrangements and operations may be omitted.

First Example Embodiment

First, a phase shifter according to a first example embodiment will be described with reference to the drawings. For example, the phase shifter of the present example embodiment is mounted on an antenna device including a patch antenna, which is a type of planar antenna. The phase shifter of the present example embodiment can be applied to transmission of a transmission target radio wave and reception of a reception target radio wave arriving from the outside. For example, the phase shifter of the present example embodiment can be applied to an antenna device used for transmission and reception of a transmission/reception target signal in a high frequency band used in mobile communication after the fifth generation mobile communication. Hereinafter, the electrical length of the transmission/reception target signal on a substrate is denoted by $\lambda$ ($\lambda$ is a real number).

Configuration

FIG. 1 is a conceptual diagram illustrating an example of a configuration of a phase shifter according to the present disclosure. A phase shifter 10 includes a 90 degree hybrid circuit 11, a varactor 12A, a varactor 12B, a stub 13A, and a stub 13B. The varactor 12A and the varactor 12B have similar configuration. Hereinafter, when the varactor 12A and the varactor 12B are not distinguished from each other, they are referred to as varactors 12. The stub 13A and the stub 13B have similar configuration. Hereinafter, when the stub 13A and the stub 13B are not distinguished from each other, they are referred to as stubs 13.

The 90 degree hybrid circuit 11 is a 90 degree hybrid circuit including 4 transmission lines. Each of the four transmission lines forms one side of a quadrangle. A port is formed at each vertex of a quadrangle formed by the four transmission lines included in the 90 degree hybrid circuit 11. The 90 degree hybrid circuit 11 includes a first port $P_1$, a second port $P_2$, a third port $P_3$, and a fourth port $P_4$. The first port $P_1$ is an input end. The first port $P_1$ receives a phase shift target signal. The second port $P_2$ is a reflection end (also referred to as a first reflection end). The varactor 12A is connected to the second port $P_2$. The third port $P_3$ is a reflection end (also referred to as a second reflection end). The varactor 12B is connected to the third port $P_3$. The fourth port $P_4$ is an output end. The phase-shifted signal is output from the fourth port $P_4$.

Figure 2:
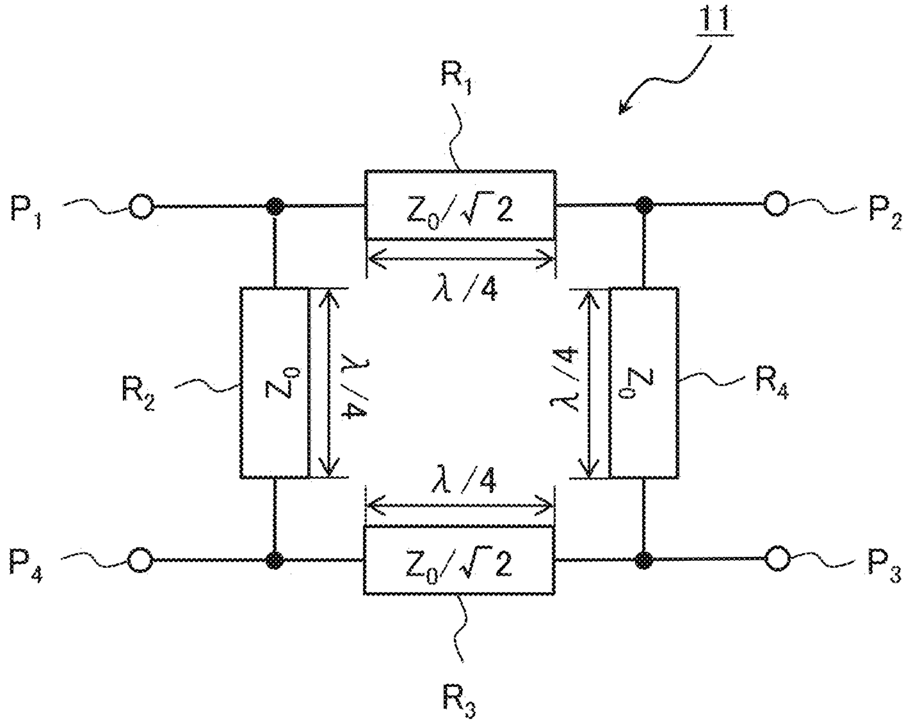
FIG. 2 is a conceptual diagram for explaining an example of a 90 degree hybrid circuit according to the present disclosure.

FIG. 2 is a conceptual diagram for explaining a 90 degree hybrid circuit according to the present disclosure. The 90 degree hybrid circuit 11 includes four transmission lines ($R_1$, $R_2$, $R_3$, $R_4$). The electrical length of each of the four transmission lines ($R_1$, $R_2$, $R_3$, $R_4$) is $\lambda/4$ (90 degrees). FIG. 2 is a diagram conceptually illustrating a 90 degree hybrid circuit according to the present disclosure, and is not a diagram accurately illustrating a structure of the 90 degree hybrid circuit.

The transmission line $R_1$ is a transmission line having an electrical length of $\lambda/4$. The characteristic impedance of the transmission line $R_1$ is $Z_0/\sqrt{2}$. The first end of the transmission line $R_1$ is connected to the first port $P_1$ (input end). Furthermore, the first end of the transmission line $R_1$ is connected to the first end of the transmission line $R_2$. The second end of the transmission line $R_1$ is connected to the first end of the transmission line $R_4$. Furthermore, the second end of the transmission line $R_1$ is connected to the second port $P_2$. The varactor 12A is connected to the second port $P_2$.

The transmission line $R_2$ is a transmission line having an electrical length of $\lambda/4$. The characteristic impedance of the transmission line $R_2$ is $Z_0$. The first end of the transmission line $R_2$ is connected to the first port $P_1$ (input end). Furthermore, the first end of the transmission line $R_2$ is connected to the first end of the transmission line $R_1$. The second end of the transmission line $R_2$ is connected to the fourth port $P_4$ (output end). The second end of the transmission line $R_2$ is connected to the first end of the transmission line $R_3$.

The transmission line $R_3$ is a transmission line having an electrical length of $\lambda/4$. The characteristic impedance of the transmission line $R_2$ is $Z_0/\sqrt{2}$. The first end of the transmission line $R_3$ is connected to the fourth port $P_4$ (output end). The first end of the transmission line $R_3$ is connected to the second end of the transmission line $R_2$. The second end of the transmission line $R_3$ is connected to the second end of the transmission line $R_4$. Furthermore, the second end of the transmission line $R_3$ is connected to the third port $P_3$. The varactor 12B is connected to the third port $P_3$.

The transmission line $R_4$ is a transmission line having an electrical length of $\lambda/4$. The characteristic impedance of the transmission line $R_4$ is $Z_0$. The first end of the transmission line $R_4$ is connected to the second end of the transmission line $R_1$. Furthermore, the first end of the transmission line $R_4$ is connected to the second port $P_2$. One of the varactors 12A is connected to the second port $P_2$. The second end of the transmission line $R_4$ is connected to the second end of the transmission line $R_3$. Furthermore, the second end of the transmission line $R_4$ is connected to the third port $P_3$. The varactor 12B is connected to the third port $P_3$.

The varactor 12A and the varactor 12B are diodes each having a variable capacitance layer made of vanadium dioxide $VO_2$. The varactor 12A and the varactor 12B are variable capacitance varactors using a phase transition of an insulating phase-metal phase of vanadium dioxide $VO_2$. Vanadium dioxide $VO_2$ contained in the variable capacitance layer is an insulating layer at a temperature lower than the phase transition temperature T. When the phase transition temperature T is exceeded, the vanadium dioxide $VO_2$ contained in the insulating phase variable capacitance layer undergoes phase transition from the insulating phase to the metal phase. The varactor 12A is disposed between the second port $P_2$ of the 90 degree hybrid circuit 11 and the stub 13A. The first end of the varactor 12A is connected to the second port $P_2$. That is, the first end of the varactor 12A is connected to the second end of the transmission line $R_1$ and the first end of the transmission line $R_4$ via the second port $P_2$. The second end of the varactor 12A is connected to the first end of the stub 13A. The varactor 12B is disposed between the third port $P_3$ of the 90 degree hybrid circuit 11 and the stub 13B. The first end of the varactor 12B is connected to the third port $P_3$. That is, the first end of the varactor 12B is connected to the second end of the transmission line $R_3$ and the second end of the transmission line $R_4$ via the third port $P_3$. The second end of the varactor 12B is connected to the first end of the stub 13B.

The stub 13A and the stub 13B are short stubs having one end connected to the ground GND. The stub 13A and the stub 13B function as inductors. The stub 13A and the stub 13B may be open stubs with one end opened. The ground GND to which the stub 13A and the stub 13B are connected is equipotential. The stub 13A is disposed between the varactor 12A and the ground GND. The first end of the stub 13A is connected to the second end of the varactor 12A. The second end of the stub 13A is connected to the ground GND. The stub 13B is disposed between the varactor 12B and the ground GND. The first end of the stub 13B is connected to the second end of the varactor 12B. The second end of the stub 13B is connected to the ground GND.

Varactor

Figure 3:
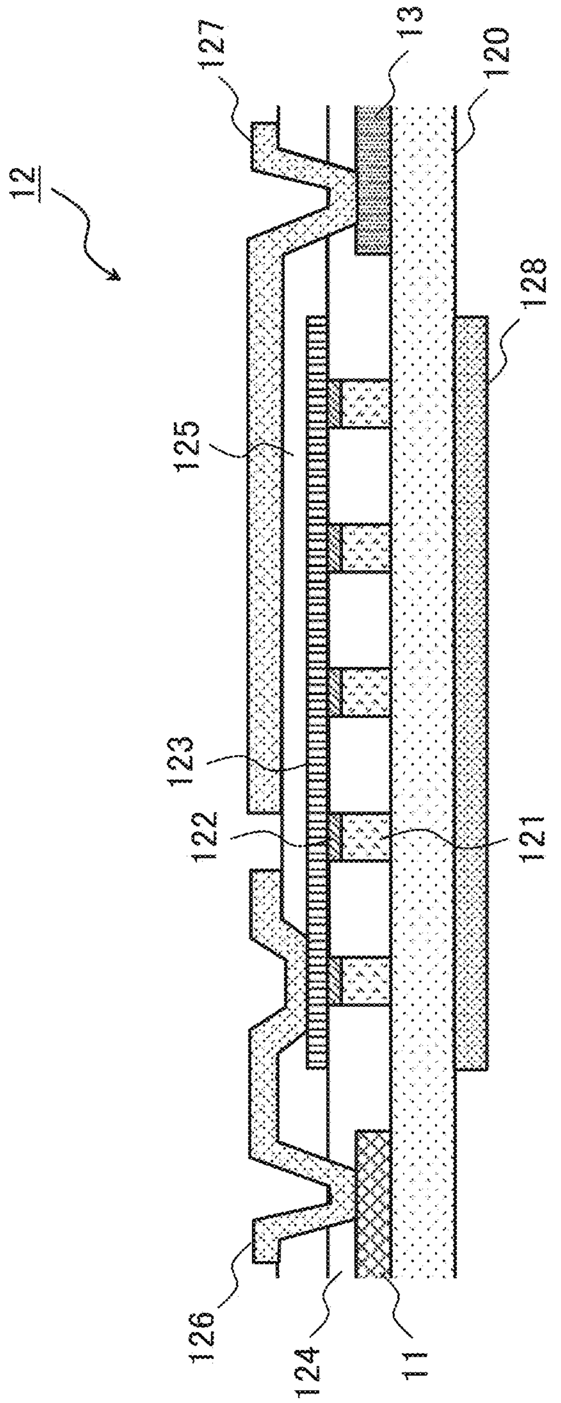
FIG. 3 is a conceptual diagram illustrating an example of a configuration of a varactor according to the present disclosure.

FIG. 3 is a conceptual diagram illustrating an example of a configuration of a varactor according to the present disclosure. FIG. 3 illustrates a cross-sectional view obtained by cutting a varactor in a longitudinal direction at a cutting line from a hybrid circuit to the stub. The varactor 12 includes a heat generation drive circuit 121, a heat generating element 122, a variable capacitance layer 123, an insulating layer 124, a capacitance formation layer 125, a connection electrode 126, an upper electrode 127, and a ground plate 128. The varactor 12 includes a plurality of heat generation drive circuits 121 and a plurality of heat generating elements 122. The 90 degree hybrid circuit 11, the varactor 12, and the stub 13 are formed on a substrate 120. For example, the substrate 120 is a plate-like member having an insulating property such as glass or epoxy resin. On the substrate 120, a matrix circuit of thin film transistors (TFTs) is formed.

The plurality of heat generation drive circuits 121 are formed on the upper surface of the substrate 120. The plurality of heat generation drive circuits 121 are formed in a two-dimensional array form in plan view of the upper surface of the substrate 120. The plurality of heat generation drive circuits 121 are isolated by an insulating layer 124. Each of the plurality of heat generation drive circuits 121 is associated with one heat generating element 122. Each of the plurality of heat generation drive circuits 121 is used for temperature control of the associated heat generating element 122.

Each of the plurality of heat generating elements 122 is associated with one heat generation drive circuit 121. Each of the plurality of heat generating elements 122 is disposed on the upper surface of the associated heat generation drive circuit 121. The variable capacitance layer 123 is formed on the upper surfaces of the plurality of heat generating elements 122. The plurality of heat generating elements 122 are isolated by the insulating layer 124. The plurality of heat generating elements 122 may be isolated by a gap formed in the insulating layer 124. The heat generating element 122 is used to heat the variable capacitance layer 123 on the upper side. For example, the heat generating element 122 is achieved by an alloy having nickel Ni or chromium Cr as a main component. The heat generating element 122 may be achieved by an alloy having chromium Cr, iron Fe, and aluminum Al as main components. The material of the heat generating element 122 is not particularly limited. When current is supplied, the temperature of the heat generating element 122 rises. For example, supply of current to the heat generating element 122 can be controlled using a thin film transistor (TFT). The heat of the heat generating element 122 is transferred to the variable capacitance layer 123.

The variable capacitance layer 123 is disposed above the plurality of heat generating elements 122. The lower surface of the variable capacitance layer 123 and the upper surfaces of the plurality of heat generating elements 122 are thermally connected. The lower surface of the variable capacitance layer 123 and the upper surfaces of the plurality of heat generating elements 122 are preferably in contact with each other. As long as the heat of the heat generating element 122 can be transferred to the variable capacitance layer 123 to control the phase transition of the capacitance formation layer 125, another layer may be interposed between the lower surface of the variable capacitance layer 123 and the upper surfaces of the plurality of heat generating elements 122. The variable capacitance layer 123 is partially heated by the heat generating element 122 at the lower position generating heat.

The variable capacitance layer 123 contains vanadium dioxide $VO_2$. The variable capacitance layer 123 changes in capacitance due to a phase transition of an insulating phase-metal phase of vanadium dioxide $VO_2$. Vanadium dioxide $VO_2$ contained in the variable capacitance layer 123 has a composition that undergoes a phase transition from an insulating phase to a metal phase at a phase transition temperature T. At a temperature lower than the phase transition temperature T, the vanadium dioxide $VO_2$ is an insulating phase. At a temperature lower than the phase transition temperature T, electricity does not flow through the vanadium dioxide $VO_2$. At a temperature higher than the phase transition temperature T, the vanadium dioxide $VO_2$ is a metal phase. At a temperature higher than the phase transition temperature T, electricity flows through the vanadium dioxide $VO_2$. The phase transition of vanadium dioxide $VO_2$ exhibits hysteresis in temperature rise and temperature fall. Therefore, the phase transition of the insulating phase-metal phase of vanadium dioxide $VO_2$ is adjusted in a temperature range including the phase transition temperature T.

For example, the variable capacitance layer 123 may have a variable capacitance layer containing vanadium dioxide $VO_2$ to which no additive element is added. For example, an additive element may be added to vanadium dioxide $VO_2$ contained in the variable capacitance layer 123. For example, an additive element for lowering the phase transition temperature may be added to vanadium dioxide $VO_2$ contained in the variable capacitance layer 123. When an additive element such as tungsten W, magnesium Mg, iron Fe, molybdenum Mo, fluorine F, or niobium Nb is added, the phase transition temperature of vanadium dioxide $VO_2$ lowers.

The insulating layer 124 covers the upper sides of the 90 degree hybrid circuit 11 and the stub 13. Furthermore, the insulating layer 124 covers the sides of the heat generation drive circuit 121 and the heat generating element 122. The variable capacitance layer 123 is disposed above the insulating layer 124. For example, the insulating layer 124 is made of a general interlayer insulating material. For example, the insulating layer 124 is made of an inorganic material such as silicon dioxide. The material of the insulating layer 124 may be an organic material.

The capacitance formation layer 125 is formed above the variable capacitance layer 123 and the insulating layer 124. In the capacitance formation layer 125, a capacitance corresponding to a potential difference between a portion of the variable capacitance layer 123 phase transitioned to the metal phase and the upper electrode 127 is formed. The potential difference between the portion of the variable capacitance layer 123 and the upper electrode 127 is controlled by a controller (not illustrated). For example, the capacitance formation layer 125 is made of a general interlayer insulating material. For example, the capacitance formation layer 125 is formed of a material such as silicon dioxide.

A connection electrode 126 electrically connects the 90 degree hybrid circuit 11 and the variable capacitance layer 123. A portion of the connection electrode 126 is electrically connected to the 90 degree hybrid circuit 11 via an opening formed in the insulating layer 124 and the capacitance formation layer 125. In addition, another portion of the connection electrode 126 is electrically connected to a part of the variable capacitance layer 123 via an opening formed in the capacitance formation layer 125. For example, the connection electrode 126 is made of metal such as aluminum or copper.

An upper electrode 127 is disposed above the capacitance formation layer 125. A portion of the upper electrode 127 is electrically connected to the stub 13 via an opening formed in the insulating layer 124 and the capacitance formation layer 125. For example, the upper electrode 127 is made of metal such as aluminum or copper.

A ground plate 128 is disposed on the lower surface of the substrate 120. The ground plate 128 is arranged to control the characteristic impedance in the layers constituting the varactor 12. The ground plate 128 is arranged to cover at least a lower region of the variable capacitance layer 123. The ground plate 128 may be disposed on the entire lower surface of the substrate 120.

Heat Generation Drive Circuit

Figure 4:
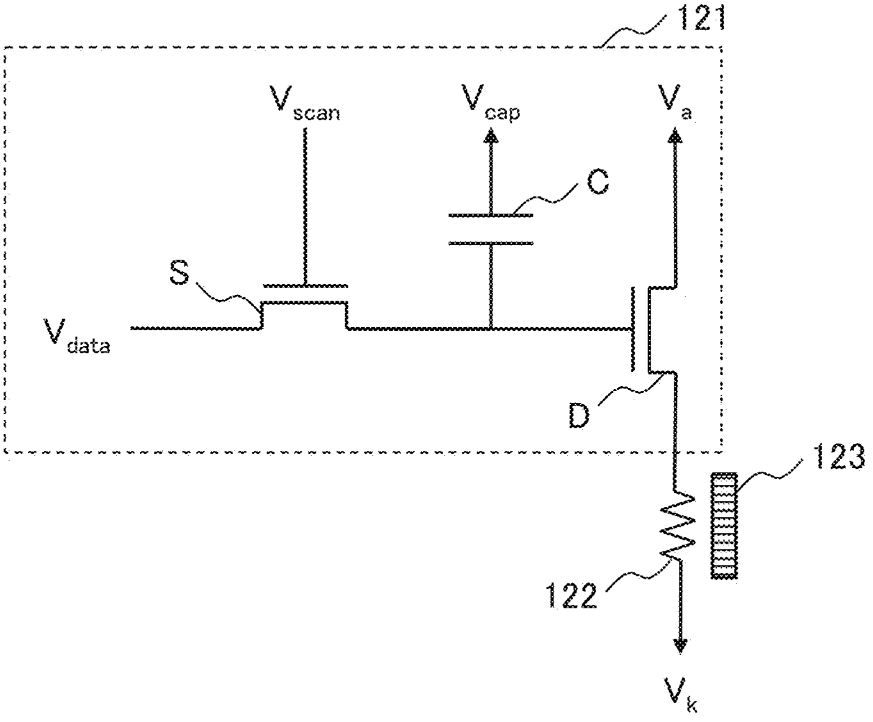
FIG. 4 is a conceptual diagram illustrating an example of a circuit configuration of a heat generation drive circuit according to the present disclosure.

FIG. 4 is a conceptual diagram illustrating an example of a circuit configuration of a heat generation drive circuit according to the present disclosure. The heat generation drive circuit 121 includes a transistor S, a transistor D, and a capacitor C. FIG. 4 illustrates an example in which the heat generating element 122 is achieved by a resistance element. Hereinafter, a connection relationship among the transistor S, the transistor D, the capacitor C, and the heat generating element 122 will be described. In the following description, directions in the plane of drawing of FIG. 4 are shown in parentheses. FIG. 4 illustrates an example of the circuit configuration of the heat generation drive circuit according to the present disclosure, and does not limit the circuit configuration of the heat generation drive circuit.

The transistor S is used to select the heat generating element 122. A first end (left side) of the diffusion layer of the transistor S is connected to a supply source of the voltage $V_{data}$. The second end (right side) of the diffusion layer of the transistor S is connected to the first electrode (lower side) of the capacitor C and the gate (left side) of the transistor D. The gate (upper side) of the transistor S is connected to a supply source of the voltage $V_{scan}$.

The capacitor C is used to control the voltage applied to the gate of the transistor D. The first electrode (lower side) of the capacitor C is connected to the second end (right side) of the diffusion layer of the transistor S and the gate (left side) of the transistor D. The second electrode (upper side) of the capacitor C is connected to a supply source of the voltage $V_{cap}$. A voltage $V_{cap}$ is applied to the second electrode (upper side) of the capacitor C.

The transistor D is used to control the voltage to be supplied to the heat generating element 122. A first end (upper side) of the diffusion layer of the transistor D is connected to a supply source of the voltage $V_a$. The voltage $V_a$ is applied to the first end (upper side) of the diffusion layer of the transistor D. The second end (lower side) of the diffusion layer of the transistor D is connected to the first electrode (lower side) of the heat generating element 122. The gate (left side) of the transistor D is connected to the second end (right side) of the diffusion layer of the transistor S and the first end (lower side) of the capacitor C.

The first end (upper side) of the heat generating element 122 is connected to the second end (lower side) of the diffusion layer of the transistor D. The second end (lower side) of the heat generating element 122 is connected to a supply source of the voltage $V_k$. The voltage $V_k$ is applied to the second end (lower side) of the heat generating element 122. When the transistor S transitions to an ON state by the application of the voltage $V_{scan}$, a voltage that is a difference between the voltage $V_{data}$ and the voltage $V_{cap}$ is applied to the capacitor C. When charging of the capacitor C is completed, the transistor S transitions to an OFF state. After the transistor S transitions to the OFF state, the capacitor C holds the voltage, and the transistor D continues to maintain the ON state according to the potential. In an ON state of the transistor D, a current corresponding to a voltage corresponding to a potential difference between the voltage $V_a$ and the voltage $V_k$ and a resistance value of the heat generating element 122 flows, and the heat generating element 122 generates heat. The heat generated in the heat generating element 122 is transferred to the variable capacitance layer 123 in thermal contact with the heat generating element 122.

Figure 5:
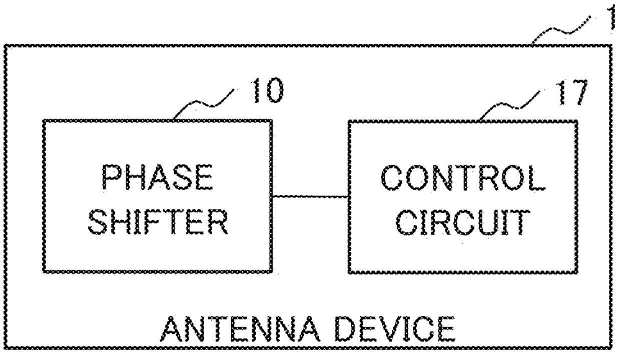
FIG. 5 is a block diagram illustrating an example of a configuration of a transfer device including a phase shifter according to the present disclosure.

FIG. 5 is a block diagram illustrating an example of a configuration of an antenna device including a phase shifter according to the present disclosure. The antenna device 1 includes a phase shifter 10 and a control circuit 17. The control circuit 17 is a circuit for controlling the phase shifter 10. For example, the control circuit 17 is achieved by a microcomputer including a processor and a memory. The control circuit 17 controls the heat generation drive circuit 121 included in the varactor 12 of the phase shifter 10 to control the conductor pattern of the variable capacitance layer 123. The capacitance of the varactor 12 is adjusted according to the control of the control circuit 17. The control circuit 17 may be configured as a component of the phase shifter 10.

Capacitance Control

Next, the capacitance control of the variable capacitance layer 123 will be described with reference to the drawings. FIGS. 6 to 13 are conceptual diagrams for explaining examples of capacitance control of the variable capacitance layer according to the present disclosure. FIGS. 6, 8, 10, and 12 are cross-sectional views of a portion of the varactor taken longitudinally at a cutting line from the hybrid circuit to the stub. FIGS. 7, 9, 11, and 13 are plan views of the upper surface of the varactor viewed from the upper viewpoint. One cell of the lattice illustrated in FIGS. 7, 9, 11, and 13 indicates a portion where the vanadium dioxide $VO_2$ contained in the variable capacitance layer undergoes phase transition by one heat generating element. In the following description, it is assumed that the 90 degree hybrid circuit 11 is arranged on the left side of the varactor 12 and the stub 13 is arranged on the right side of the varactor 12.

In the examples of FIGS. 6 to 13, a plurality of heat generation drive circuits 121-1 to 121-4 and a plurality of heat generating elements 122-1 to 122-4 are illustrated. The plurality of heat generation drive circuits 121-1 to 121-4 are similarly controlled in the short direction of the varactor 12. The heat generating element 122-1 is associated with the heat generation drive circuit 121-1. When the heat generation drive circuit 121-1 transitions to ON, the heat generating element 122-1 generates heat. The heat generating element 122-2 is associated with the heat generation drive circuit 121-2. When the heat generation drive circuit 121-2 transitions to ON, the heat generating element 122-2 generates heat. The heat generating element 122-3 is associated with the heat generation drive circuit 121-3. When the heat generation drive circuit 121-3 transitions to ON, the heat generating element 122-3 generates heat. The heat generating element 122-4 is associated with the heat generation drive circuit 121-4. When the heat generation drive circuit 121-4 transitions to ON, the heat generating element 122-4 generates heat.

Figure 6:
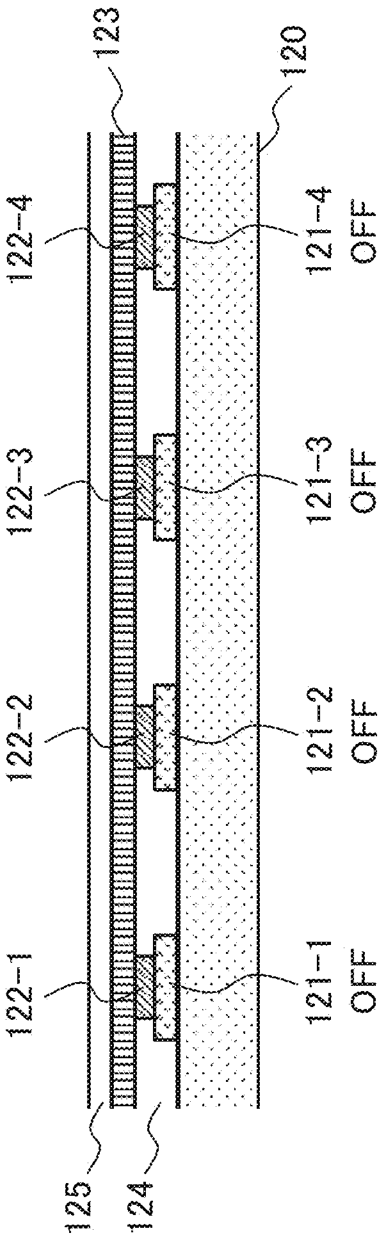
FIG. 6 is a conceptual diagram for explaining an example of capacitance control of a variable capacitance layer according to the present disclosure.
Figure 7:
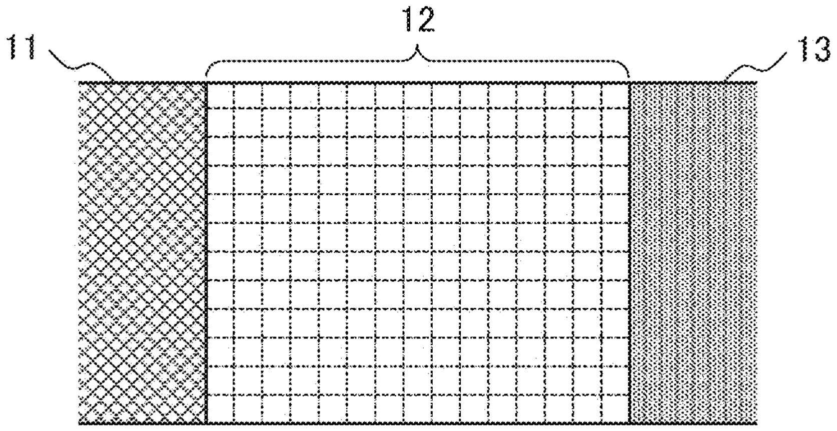
FIG. 7 is a conceptual diagram for explaining an example of capacitance control of the variable capacitance layer according to the present disclosure.

FIGS. 6 to 7 are conceptual diagrams illustrating an example of a state in which the heat generating element included in the varactor of the phase shifter according to the present disclosure is not heated. In this example, none of the plurality of heat generation drive circuits 121-1 to 121-4 is selected. Therefore, none of the plurality of heat generating elements 122-1 to 122-4 generates heat. FIG. 7 illustrates a state in which one entire surface of the varactor 12 has not transitioned to a conductor. As described above, in the examples of FIGS. 6 to 7, the variable capacitance layer 123 does not transition to a conductor.

Figure 8:
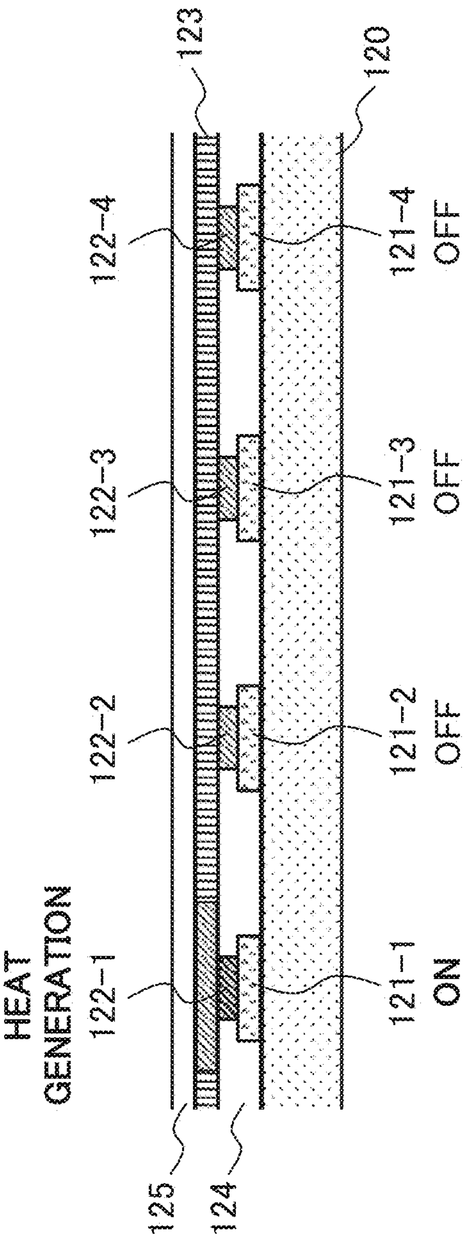
FIG. 8 is a conceptual diagram for explaining an example of capacitance control of the variable capacitance layer according to the present disclosure.
Figure 9:
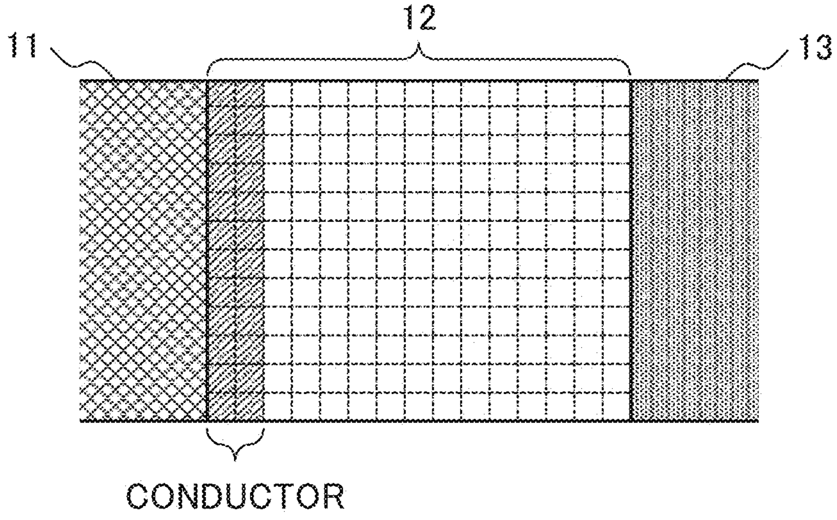
FIG. 9 is a conceptual diagram for explaining an example of capacitance control of the variable capacitance layer according to the present disclosure.

FIGS. 8 to 9 are conceptual diagrams illustrating an example of a state in which some heat generating elements included in the varactor of the phase shifter according to the present disclosure are heated. In this example, the heat generation drive circuit 121-1 is selected. Therefore, the heat generating element 122-1 generates heat according to the selection of the heat generation drive circuit 121-1. In FIG. 9, hatching indicates a state in which a part of the varactor 12 heated in accordance with heat generation of the heat generating element 122-1 has transitioned to a conductor. As described above, in the examples of FIGS. 8 to 9, the variable capacitance layer 123 above the heat generating element 122-1 that has generated heat transitions to a conductor.

Figure 10:
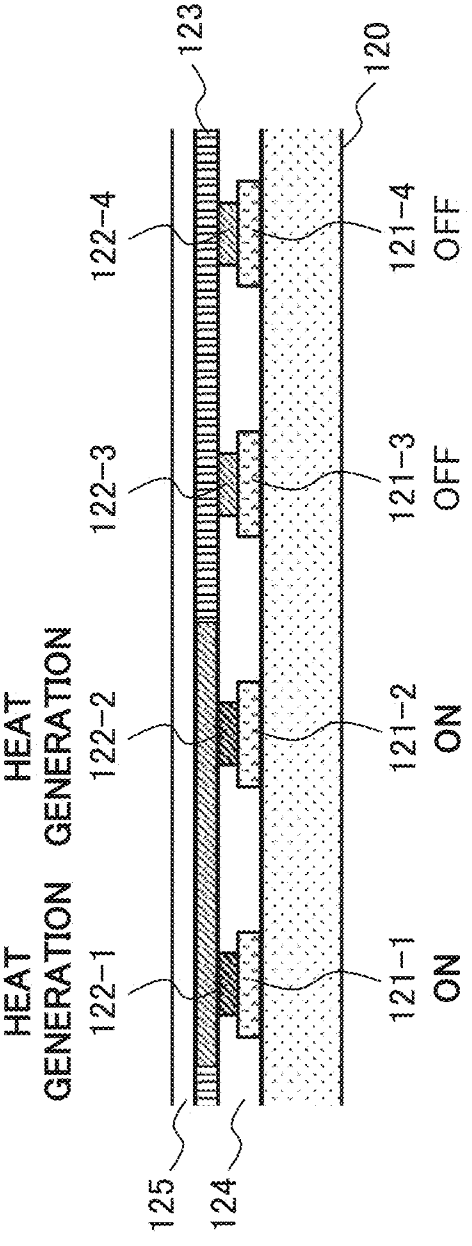
FIG. 10 is a conceptual diagram for explaining an example of capacitance control of the variable capacitance layer according to the present disclosure.
Figure 11:
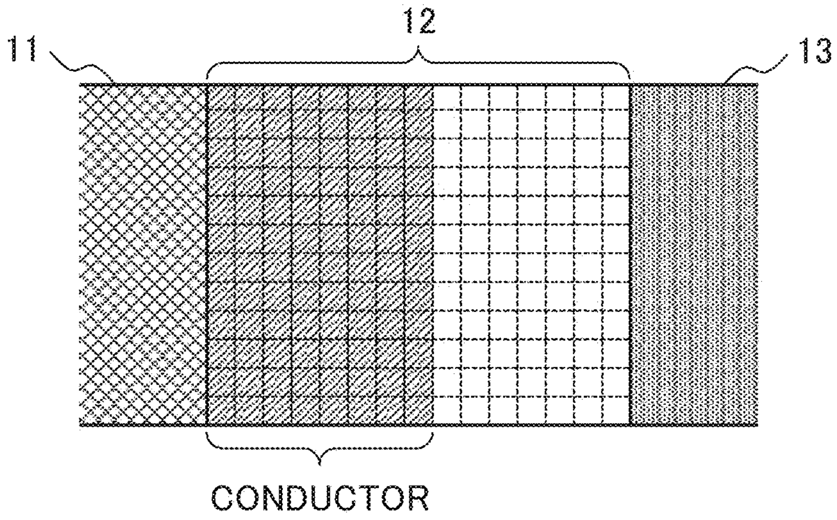
FIG. 11 is a conceptual diagram for explaining an example of capacitance control of the variable capacitance layer according to the present disclosure.

FIGS. 10 to 11 are conceptual diagrams illustrating another example of a state in which some heat generating elements included in the varactor of the phase shifter according to the present disclosure are heated. In this example, the heat generation drive circuits 121-1 to 121-2 are selected. Therefore, the heat generating elements 122-1 to 122-2 generate heat in accordance with the selection of the heat generation drive circuits 121-1 to 121-2. In FIG. 11, hatching indicates a state in which a part of the varactor 12 heated in accordance with heat generation of the heat generating elements 122-1 to 122-2 has transitioned to a conductor. As described above, in the examples of FIGS. 10 to 11, the variable capacitance layer 123 above the heat generating elements 122-1 to 122-2 that have generated heat transitions to a conductor.

Figure 12:
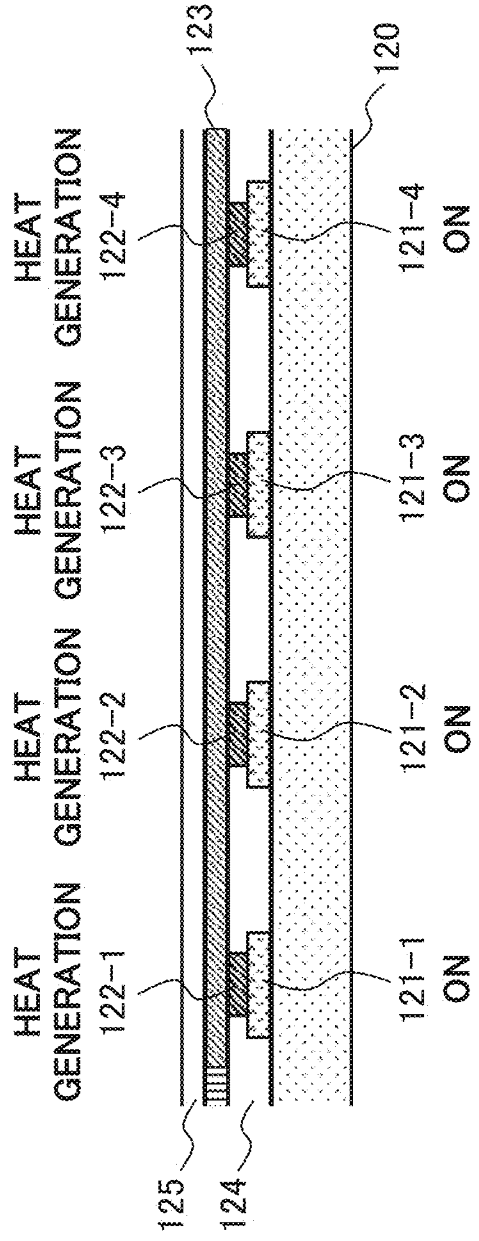
FIG. 12 is a conceptual diagram for explaining an example of capacitance control of the variable capacitance layer according to the present disclosure.
Figure 13:
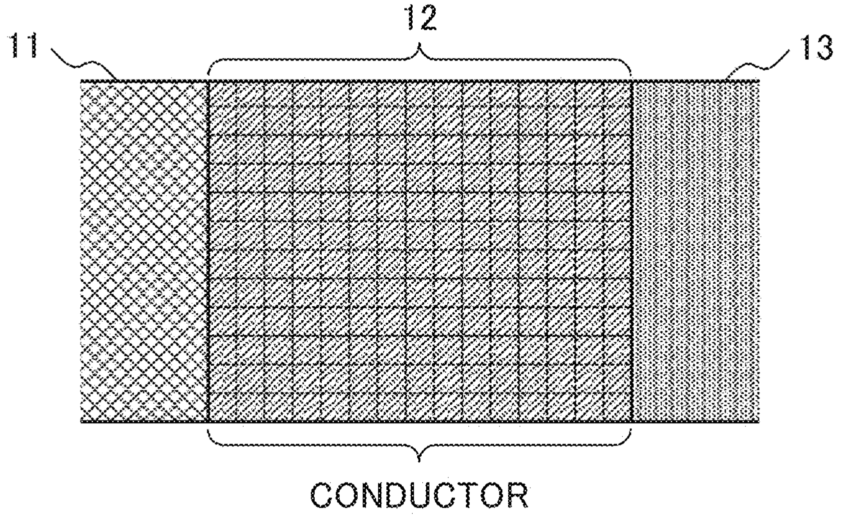
FIG. 13 is a conceptual diagram for explaining an example of capacitance control of the variable capacitance layer according to the present disclosure.

FIGS. 12 to 13 are conceptual diagrams illustrating an example of a state in which some heat generating elements included in the varactor of the phase shifter according to the present disclosure are heated. In this example, the heat generation drive circuits 121-1 to 121-4 are all selected. Therefore, the heat generating elements 122-1 to 122-4 generate heat in accordance with the selection of the heat generation drive circuits 121-1 to 121-4. In FIG. 13, hatching indicates a state in which a part of the varactor 12 heated in accordance with heat generation of the heat generating elements 122-1 to 122-4 has transitioned to a conductor. As described above, in the examples of FIGS. 12 to 13, the variable capacitance layer 123 above the heat generating elements 122-1 to 122-4 that have generated heat transitions to a conductor.

As in the examples of FIGS. 6 to 13, the capacitance of the variable capacitance layer 123 can be controlled by selecting the heat generation drive circuit 121 associated with the heat generating element 122 to be transitioned in the conductor. The phase shift amount of the phase shifter 10 can be adjusted according to the capacitance of the variable capacitance layer 123.

Conductor Pattern

Figure 14:
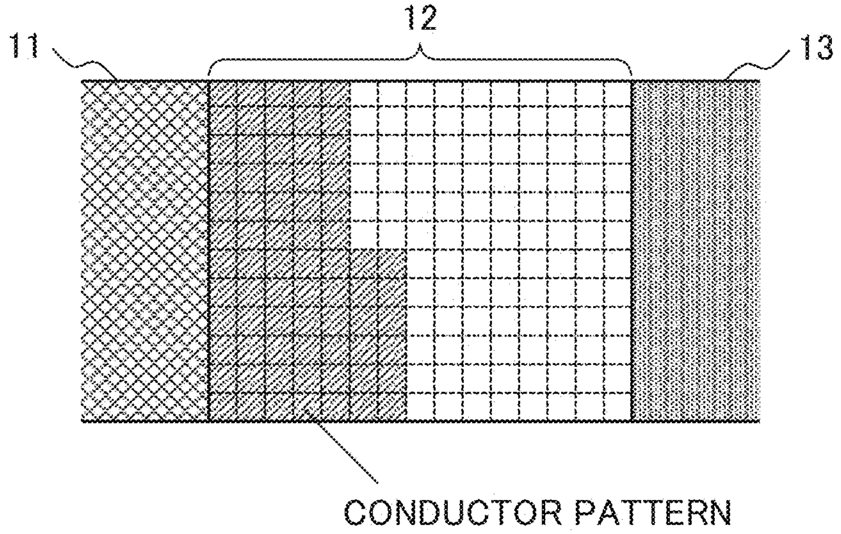
FIG. 14 is a conceptual diagram illustrating a first example of a conductor pattern formed in the varactor of the phase shifter according to the present disclosure.
Figure 15:
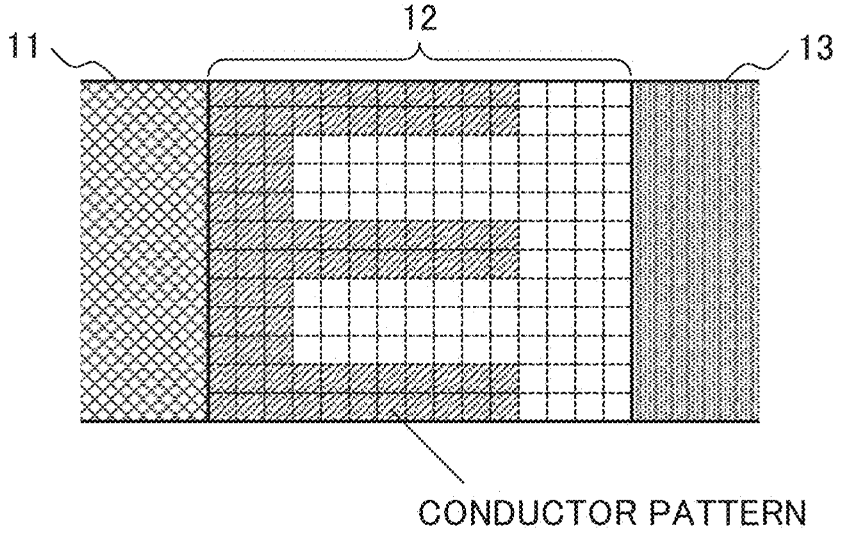
FIG. 15 is a conceptual diagram illustrating a second example of a conductor pattern formed in the varactor of the phase shifter according to the present disclosure.
Figure 16:
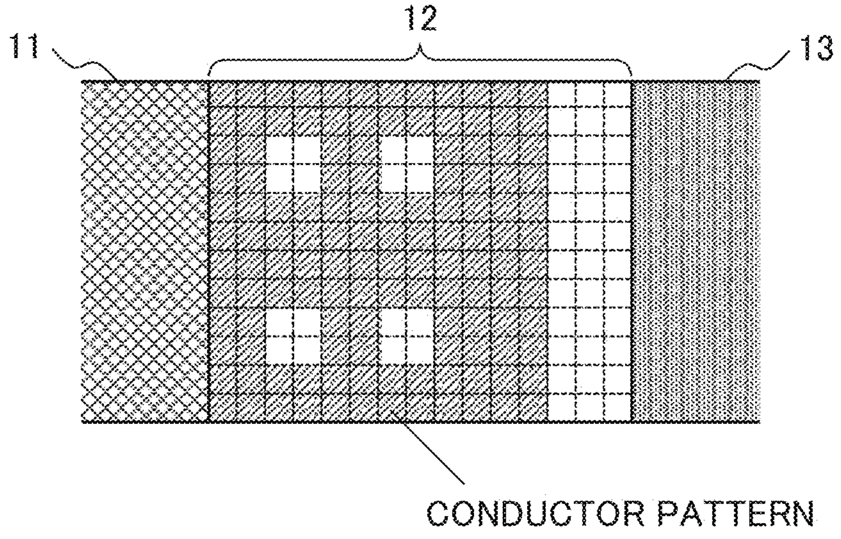
FIG. 16 is a conceptual diagram illustrating a third example of a conductor pattern formed in the varactor of the phase shifter according to the present disclosure.

Next, an example of forming a conductor pattern formed on the variable capacitance layer 123 by controlling the plurality of heat generating elements 122 will be described. FIGS. 14 to 16 are conceptual diagrams illustrating a conductor pattern formed in the varactor of the phase shifter according to the present disclosure. FIGS. 14 to 16 are plan views of the upper surface of the varactor viewed from the upper viewpoint. One cell of the lattice illustrated in FIGS. 14 to 16 indicates a portion where the vanadium dioxide $VO_2$ contained in the variable capacitance layer undergoes phase transition by one heat generating element. In FIGS. 14 to 16, the conductor pattern formed in the varactor is indicated by hatching. In the following description, it is assumed that the 90 degree hybrid circuit 11 is arranged on the left side of the varactor 12 and the stub 13 is arranged on the right side of the varactor 12.

FIG. 14 is a conceptual diagram illustrating a first example of a conductor pattern formed in the varactor of the phase shifter according to the present disclosure. In the first example, among the columns formed by the lattice transitioned to the conductor, all the five columns on the left side have transitioned to the conductor, but the upper parts of the two columns on the right side have not transitioned to the conductor. In the first example, not a rectangular shape but an asymmetric conductor pattern is formed in the varactor 12.

FIG. 15 is a conceptual diagram illustrating a second example of a conductor pattern formed in the varactor of the phase shifter according to the present disclosure. In the second example, among the columns formed by the lattice transitioned to the conductor, all the three columns on the left side have transitioned to the conductor, but a part of the eight columns on the right side have not transitioned to the conductor. In the second example, an alphabet E-type conductor pattern is formed.

FIG. 16 is a conceptual diagram illustrating a third example of a conductor pattern formed in the varactor of the phase shifter according to the present disclosure. In the third example, a part of the rectangle formed by the lattice that has transitioned to the conductor has not transitioned to the conductor. In the third example, a conductor pattern in which a lattice of one part is lost is formed.

As in the examples of FIGS. 14 to 16, the conductor pattern formed in the varactor 12 can be set to any shape. For example, the conductor pattern formed in the varactor 12 can be finely set according to a desired phase shift amount.

Figures 17, 18:
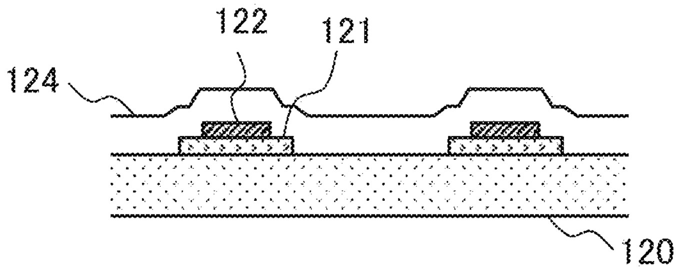
FIG. 17 is an example of a table used to select a conductor pattern formed on the varactor according to the present disclosure.
FIG. 18 is a conceptual diagram for explaining an example of a method of manufacturing a phase shifter according to the present disclosure.

FIG. 17 is an example of a table (phase shift table 130) used to select a conductor pattern formed in the varactor according to the present disclosure. The phase shift table 130 stores a conductor pattern $P_c$ related to a desired phase shift amount. The conductor pattern $P_c$ is associated with an address indicating a position of the heat generating element 122 caused to generate heat for forming the conductor pattern $P_c$. The conductor pattern $P_{c1}$ is associated with the phase shift amount 0. The conductor pattern $P_{c2}$ is associated with the phase shift amount ¼λ. The conductor pattern $P_{c3}$ is associated with the phase shift amount ½λ. For example, a desired phase shift amount is set via an input device (not illustrated). The control circuit 17 selects the heat generation drive circuit 121 to be used for forming the conductor pattern $P_c$ related to the set desired phase shift amount. As a result, a capacitance corresponding to a desired phase shift amount is set in the varactor 12.

Manufacturing Method

Next, a method for manufacturing the phase shifter 10 according to the present example embodiment will be described with reference to the drawings. FIGS. 18 to 21 are conceptual diagrams for explaining an example of the method of manufacturing the phase shifter according to the present disclosure. FIGS. 18 to 21 show cross-sectional views of a portion of the phase shifter 10. FIGS. 18 to 21 illustrate a part of the manufacturing processes of the varactor 12 including the variable capacitance layer 123 made of vanadium dioxide $VO_2$ in the manufacturing processes of the phase shifter 10.

FIG. 18 illustrates a state in which the insulating layer 124 is formed above the heat generation drive circuit 121 and the heat generating element 122 formed on the upper surface of the substrate 120. For example, the substrate 120 is a glass substrate. The heat generation drive circuit 121 is formed as a switch control circuit matrix of TFTs on the upper surface of the substrate 120. The heat generating element 122 is formed on the upper surface of the heat generation drive circuit 121. The heat generating element 122 is switched by a switch control circuit matrix including a plurality of heat generation drive circuits 121. The insulating layer 124 is formed to prevent unnecessary contact of the heat generation drive circuit 121 and the heat generating element 122 with the upper side. The material of the insulating layer 124 may be an inorganic material or an organic material. For example, the insulating layer 124 is formed by a chemical vapor deposition method or a physical vapor deposition method.

Figure 19:
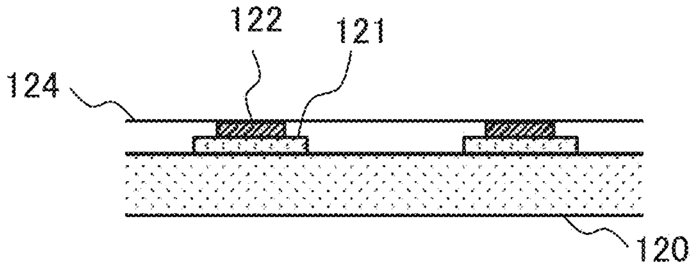
FIG. 19 is a conceptual diagram for explaining an example of the method of manufacturing the phase shifter according to the present disclosure.

FIG. 19 illustrates a state in which the insulating layer 124 formed above the heat generation drive circuit 121 and the heat generating element 122 is flattened. Flattening is a process for improving the flatness of the variable capacitance layer 123 stacked thereon. For example, the insulating layer 124 is flattened by chemical mechanical polishing (CMP). The insulating layer 124 may be flattened by reflowing using an organic film and then etching back.

Figure 20:
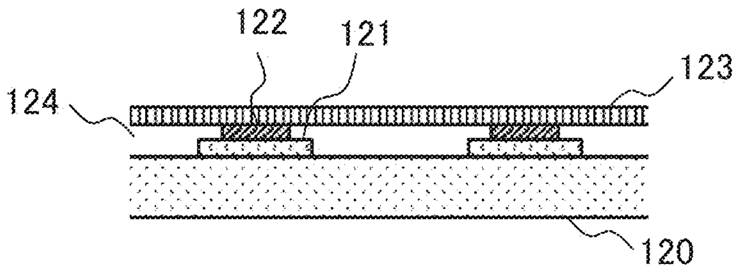
FIG. 20 is a conceptual diagram for explaining an example of the method of manufacturing the phase shifter according to the present disclosure.

FIG. 20 illustrates a state in which the variable capacitance layer 123 containing vanadium dioxide $VO_2$ is stacked on the upper surface of the flattened insulating layer 124. For example, the variable capacitance layer 123 is formed by performing heat treatment or light irradiation on the vanadium formed by a chemical vapor deposition method or a physical vapor deposition method. The variable capacitance layer 123 may be formed by firing or irradiating with ultraviolet light a film containing a vanadium organic compound formed by a spin coating method or the like.

Figure 21:
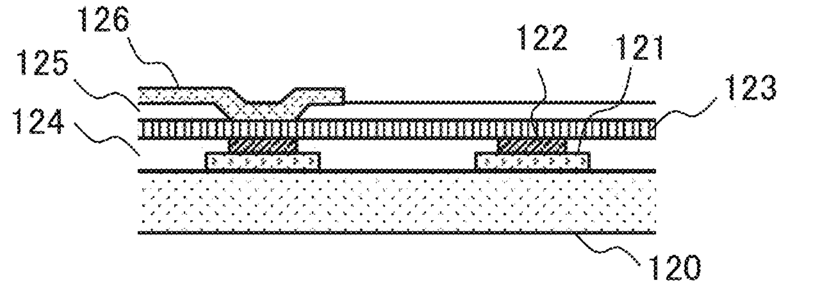
FIG. 21 is a conceptual diagram for explaining an example of the method of manufacturing the phase shifter according to the present disclosure.

FIG. 21 illustrates a state in which the connection electrode 126 is formed in a portion of a contact hole opened in a part of the capacitance formation layer 125 formed on the upper surface of the variable capacitance layer 123. The capacitance formation layer 125 is an insulating layer. The material of the capacitance formation layer 125 may be an inorganic material or an organic material. For example, the capacitance formation layer 125 is formed by a chemical vapor deposition method or a physical vapor deposition method. For example, the contact hole is formed using a technique such as photolithography. The connection electrode 126 is formed in a region including the contact hole portion. For example, the connection electrode 126 can be formed by depositing metal from above the photoresist on which the electrode pattern is formed and removing the photoresist. A method for forming the connection electrode 126 is not particularly limited.

The manufacturing processes illustrated in FIGS. 18 to 21 are an example, and do not limit a part of the manufacturing processes of the phase shifter 10. The manufacturing process of the phase shifter 10 may include processes other than the manufacturing processes shown in FIGS. 18 to 21. The phase shifter 10 is incorporated in an antenna device that functions as a phased array antenna. Therefore, the manufacturing processes illustrated in FIGS. 18 to 21 are included in the manufacturing processes of the antenna device incorporating the phase shifter 10.

As described above, the phase shifter according to the present example embodiment includes the 90 degree hybrid circuit, the varactor, and the stub. The 90 degree hybrid circuit has two reflection ends. For example, the 90 degree hybrid circuit is a 90 degree hybrid circuit having two reflection ends. The varactor has a variable capacitance layer made of vanadium dioxide. The varactor is disposed at a reflection end of the 90 degree hybrid circuit. One varactor is disposed at each of the two reflection ends of the 90 degree hybrid circuit. The stub is connected to the reflection end of the 90 degree hybrid circuit by way of the varactor. One stub is disposed in each of the two varactors. The stub is a short stub.

The phase shifter of the present example embodiment includes a variable capacitance layer made of vanadium dioxide. By performing a temperature control, a conductor pattern corresponding to the phase transition of the insulating phase-metal phase of vanadium dioxide is formed in the variable capacitance layer. A continuous phase shift amount can be stably set in the variable capacitance layer by controlling the size and shape of the conductor pattern to be formed. Therefore, according to the phase shifter of the present example embodiment, a continuous phase shift change can be achieved with a stable phase shift amount.

In one aspect of the present example embodiment, the varactor includes a plurality of heat generating elements and a plurality of heat generation drive circuits. The plurality of heat generating elements are arranged in an array form along one surface of the variable capacitance layer. Each of the plurality of heat generation drive circuits is disposed one by one in association with each of the plurality of heat generating elements. Each of the plurality of heat generating elements is thermally connected to the variable capacitance layer. Each of the plurality of heat generation drive circuits causes the heat generating element to generate heat to a temperature exceeding the phase transition temperature of vanadium dioxide contained in the variable capacitance layer according to selection of the heat generating element. According to the present aspect, a desired phase shift amount can be set by selecting a heat generating element according to the phase shift amount.

In one aspect of the present example embodiment, a conductor pattern is formed in the variable capacitance layer by heat generation corresponding to the selection of a plurality of heat generating elements. In the varactor, a capacitance corresponding to the conductor pattern formed in the variable capacitance layer is formed. According to the present aspect, a desired phase shift amount can be set by forming a conductor pattern corresponding to the phase shift amount in the variable capacitance layer.

In one aspect of the present example embodiment, a conductor pattern extended in a quadrangular shape according to the capacitance of the varactor equivalent to a desired phase shift amount is formed in the variable capacitance layer from the reflection end toward the stub. According to the present aspect, a desired phase shift amount can be set by forming a conductor pattern extended in a quadrangular shape in the variable capacitance layer.

In one aspect of the present example embodiment, a conductor pattern having an optional shape is formed in the variable capacitance layer from the reflection end toward the stub according to the capacitance of the varactor equivalent to a desired phase shift amount. According to the present aspect, a desired phase shift amount can be set by forming a conductor pattern corresponding to the phase shift amount in the variable capacitance layer.

In one aspect of the present example embodiment, a heat generation drive circuit that causes a heat generating element used for forming a conductor pattern corresponding to a desired phase shift amount to generate heat is selected using a phase shift table in which a conductor pattern corresponding to the phase shift amount is registered. In the variable capacitance layer, a conductor pattern corresponding to the conductor pattern set using the phase shift table is formed. According to the present aspect, a desired phase shift amount can be easily set using the phase shift table.

Second Example Embodiment

Next, an antenna device according to a second example embodiment will be described with reference to the drawings. A planar antenna of the present example embodiment includes a patch antenna, which is a type of planar antenna. Hereinafter, description of a transmission device for transmitting a radio wave from the planar antenna and a reception device for receiving a radio wave received by the planar antenna will be omitted. For example, the planar antenna of the present example embodiment is used for transmission and reception of electromagnetic waves in a high frequency band expected to be applied to mobile communication of Beyond 5 Generation (B5G) subsequent to 5 Generation (5G). For example, the planar antenna of the present example embodiment is used for transmission and reception of signals of millimeter waves and terahertz waves. The planar antenna of the present example embodiment may be used for transmission and reception of signals other than millimeter waves and terahertz waves.

The antenna device of the present example embodiment includes the phase shifter according to the first example embodiment. For example, the phase shifter is formed using a manufacturing process technology of micro Light Emitting Diode (LED) display. In addition, the planar antenna of the present example embodiment includes a switching element formed using a manufacturing process technology of a thin-film transistor (TFT). The planar antenna of the present example embodiment is manufactured by combining a manufacturing process technology of a micro LED display (micro LED process technology) and a manufacturing process technology of a thin film transistor (TFT process technology). The planar antenna of the present example embodiment may be manufactured using a technology other than the micro LED process technology and the TFT process technology.

Configuration

Figure 22:
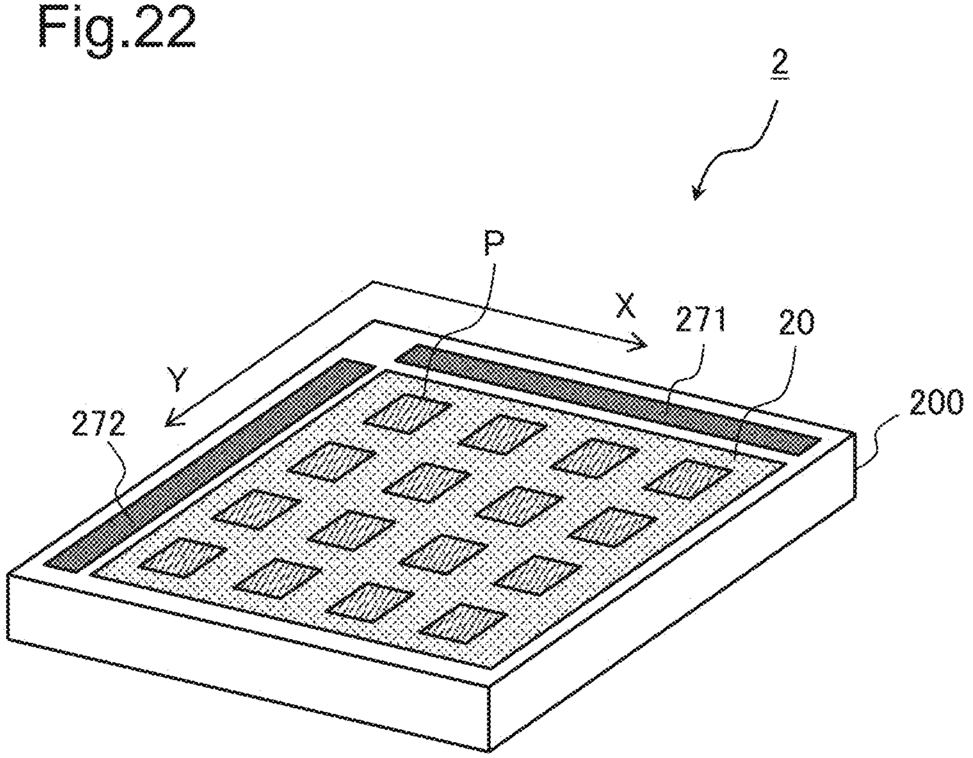
FIG. 22 is a conceptual diagram illustrating an example of a configuration of an antenna device according to the present disclosure.

FIG. 22 is a conceptual diagram illustrating an example of a configuration of an antenna device according to the present disclosure. FIG. 22 illustrates an example of an external appearance of the antenna device. The antenna device 2 includes a planar antenna 200. An antenna array 20 is arranged on the upper surface of the planar antenna 200. The antenna array 20 includes a plurality of patch antennas P. The plurality of patch antennas P are arrayed in a two-dimensional array form. In the example of FIG. 22, the plurality of patch antennas P are arrayed along the X direction and the Y direction. The plurality of patch antennas P are phased arrayed. That is, the antenna device 2 functions as a phased array antenna.

A first drive circuit 271 and a second drive circuit 272 are mounted on the antenna device 2. The first drive circuit 271 and the second drive circuit 272 are circuits used to select the patch antenna P to be driven. An address associated to each of the patch antennas P can be selected by driving the first drive circuit 271 and the second drive circuit 272. The first drive circuit 271 and the second drive circuit 272 may be formed on the surface of the planar antenna 200 or may be formed inside the planar antenna 200.

Figure 23:
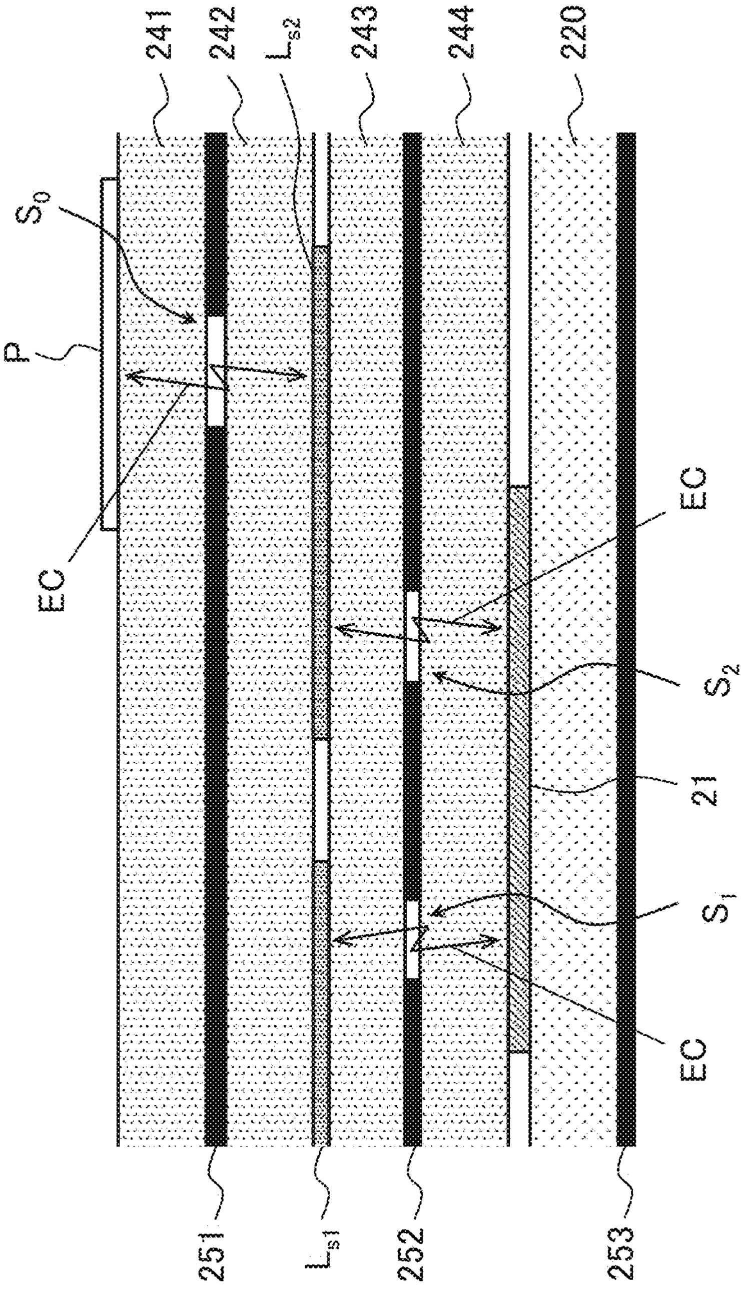
FIG. 23 is a conceptual diagram illustrating an example of a configuration of the antenna device according to the present disclosure.

FIG. 23 is a conceptual diagram illustrating an example of a configuration of the antenna device according to the present disclosure. FIG. 23 is a cross-sectional view of the antenna device 2 taken along a cutting line passing through the patch antenna P. The antenna device 2 includes a patch antenna P, an insulating layer, a ground layer, a signal line layer, a substrate 220, and a phase shifter forming layer. The insulating layer includes a first insulating layer 241, a second insulating layer 242, a third insulating layer 243, and a fourth insulating layer 244. The ground layer includes a first ground layer 251, a second ground layer 252, and a third ground layer 253. The signal line layer includes a signal line $L_{s1}$ and a signal line $L_{s2}$. The phase shifter 21 associated with the patch antenna P is formed in the phase shifter forming layer. FIG. 23 illustrates an example in which the signal line layer and the patch antenna P are formed in different layers. The antenna device according to the present example embodiment may be configured as a coplanar side antenna in which the signal line layer and the patch antenna P are formed in the same layer. The third ground layer 253 may not be provided, and substrate 220 may be disposed at a position of the fourth insulating layer 244.

The antenna array 20 is disposed on the upper surface of the first insulating layer 241. The antenna array 20 includes a plurality of patch antennas P. Although a single patch antenna P is illustrated in FIG. 23, the antenna device 2 includes a plurality of patch antennas P. The plurality of patch antennas P are arranged in a lattice shape along two directions orthogonal to each other. The plurality of patch antennas P are phased arrayed. The patch antenna P is a plate-shaped radiation element. For example, the patch antenna P has a square shape. The shape of the patch antenna P is not limited to a square shape, and may be a circular shape or other shapes.

The patch antenna P is power supplied by an electromagnetic coupling power supplying method. The patch antenna P is electromagnetically coupled to the signal line $L_{s2}$ formed below the second insulating layer 242 via the slot $S_0$. The patch antenna P is excited by electromagnetic coupling between the patch antenna P and the signal line $L_{s2}$ via the slot $S_0$. The impedance can be matched by arranging the open end of the signal line $L_{s2}$ at a position away from immediately below the slot $S_0$ by about ¼ wavelength and adjusting the dimension of the slot $S_0$. For example, the shape of the slot $S_0$ is rectangular. For example, the shape of the slot $S_0$ may be a shape other than a rectangle, such as a dog-bone shape.

The patch antenna P has a structure equivalent to that of a microstrip line whose both ends are opened. The resonance frequency of the patch antenna P is an integral multiple of ½ of a wavelength equivalent to the length of one side of the patch antenna P. The size of the patch antenna P is set according to the wavelength of the transmission target radio wave. Since the patch antenna P is an open type resonator that resonates at a resonance frequency, the Q factor decreases due to radio wave radiation. In order to avoid a decrease in the Q factor due to radio wave radiation and to operate the patch antenna P as a resonator, it is preferable that the dielectric constants of the materials of the insulating layer and the substrate 220 are as high as possible. As the dielectric constants of the materials of the insulating layer and the substrate 220 become higher, the transmission of radio waves can be further suppressed. When the material of the insulating layer and the substrate 220 is a high dielectric, the thickness of the insulating layer and the substrate 220 and the width of the patch antenna P are set to be sufficiently small with respect to the wavelength of the radio wave used in communication. For example, in a case where the material of the insulating layer and the substrate 220 is a low dielectric, a microstrip antenna can be configured by increasing the thickness of the insulating layer and the width of the patch antenna P with respect to the wavelength of the transmission target radio wave to increase the radiation amount.

The patch antenna Pis preferably configured such that a signal (radio wave) is easily radiated into space. On the other hand, an internal wiring such as a signal line or a wiring is configured such that a signal is less likely to be radiated. That is, it is better the smaller the dielectric constant required at the periphery of the patch antenna P, and it is better the larger the better the dielectric constant required around the internal wiring. Therefore, it is preferable that different manufacturing processes are applied to the structure around the patch antenna P and the structure around the internal wiring. For example, by applying a method of forming a structure around the patch antenna P by a liquid crystal process and forming a structure around the internal wiring by a thin film process, the structure of the antenna device 2 of the present example embodiment can be achieved.

The first insulating layer 241 forms a surface of the antenna device 2. The first insulating layer 241 is stacked on the upper surface of the first ground layer 251. For example, the material of the first insulating layer 241 is glass, glass epoxy, tetrafluoroethylene, epoxy, or the like. As long as communication radio waves can be transmitted and received, the first insulating layer 241 may be made of a material other than glass, glass epoxy, tetrafluoroethylene, epoxy, or the like.

The first ground layer 251 is stacked on the upper surface of the second insulating layer 242. The first insulating layer 241 is stacked on an upper surface of the first ground layer 251. For example, a material of the first ground layer 251 is metal (including alloy) such as copper, aluminum, and chromium. The potential of the first ground layer 251 is a ground potential. An opening is formed in the first ground layer 251. The opening formed in the first ground layer 251 is referred to as a slot $S_0$. The slot $S_0$ is formed below the patch antenna P. The signal line $L_{s2}$ is extended immediately below the slot $S_0$. The signal propagated through the signal line $L_{s2}$ is propagated to the patch antenna P by electromagnetic coupling EC between the signal line $L_{s2}$ and the patch antenna P.

The second insulating layer 242 is formed above the signal line layer. The first ground layer 251 is formed on an upper surface of the second insulating layer 242. An opening (air gap) may be formed in a portion of the second insulating layer 242 corresponding to a position below the patch antenna P. When the air gap is formed, the dielectric constant between the signal line $L_{s2}$ and the patch antenna P lowers. That is, in order to lower the dielectric constant between the signal line $L_{s2}$ and the patch antenna P, an air gap merely needs to be formed. For example, the material of the second insulating layer 242 is glass, glass epoxy, tetrafluoroethylene, epoxy, or the like. As long as communication radio waves can be transmitted and received, the second insulating layer 242 may be made of a material other than glass, glass epoxy, tetrafluoroethylene, epoxy, or the like.

The signal line layer is formed on the upper surface of the third insulating layer 243. The second insulating layer 242 is stacked on the upper surface of the signal line layer. The signal line layer includes a signal line $L_{s1}$ and a signal line $L_{s2}$. The signal line $L_{s1}$ (first signal line) is connected to a signal source (not illustrated). The signal sent out from the signal source is propagated to the signal line $L_{s1}$. The signal before the phase shift is propagated to the signal line $L_{s1}$. The signal line $L_{s2}$ (second signal line) is extended in such a way as to pass below the slot $S_0$ of the first ground layer 251. Capacitances corresponding to the dielectric constants of the first insulating layer 241 and the second insulating layer 242 are formed between the signal line $L_{s2}$ and the patch antenna P. In the signal line $L_{s2}$, the phase-shifted signal phase-shifted by the phase shifter 21 is propagated to the patch antenna P by the electromagnetic coupling EC via the slot $S_0$.

The third insulating layer 243 is formed above the second ground layer 252. A signal line layer is formed on the upper surface of the third insulating layer 243. For example, the material of the third insulating layer 243 is glass, glass epoxy, tetrafluoroethylene, epoxy, or the like. As long as communication radio waves can be transmitted and received, the third insulating layer 243 may be made of a material other than glass, glass epoxy, tetrafluoroethylene, epoxy, or the like.

The second ground layer 252 is stacked on the upper surface of the fourth insulating layer 244. The second insulating layer 242 is stacked on an upper surface of the second ground layer 252. For example, a material of the second ground layer 252 is metal (including alloy) such as copper, aluminum, and chromium. The potential of the second ground layer 252 is a ground potential. Two types of openings are formed in second ground layer 252. The two types of openings formed in the second ground layer 252 are referred to as a slot $S_1$ and a slot $S_2$. The slot $S_1$ is formed at a position between the signal line $L_{s1}$ and the phase shifter 21. The slot $S_2$ is formed at a position between the signal line $L_{s2}$ and the phase shifter 21. Capacitances corresponding to the dielectric constants of the third insulating layer 243 and the fourth insulating layer 244 are formed between the signal line $L_{s1}$ and the phase shifter 21. Similarly, capacitances corresponding to the dielectric constants of the third insulating layer 243 and the fourth insulating layer 244 are formed between the signal line $L_{s2}$ and the phase shifter 21. The signal propagated through the signal line $L_{s1}$ is propagated to the phase shifter 21 by the electromagnetic coupling EC via the slot $S_1$. The signal propagated to the phase shifter 21 is phase-shifted by the phase shift amount set in the phase shifter 21 and propagated to the signal line $L_{s2}$ by the electromagnetic coupling EC via the slot $S_2$.

The fourth insulating layer 244 is formed above the phase shifter forming layer. The second ground layer 252 is formed on an upper surface of the fourth insulating layer 244. For example, the material of the fourth insulating layer 244 is glass, glass epoxy, tetrafluoroethylene, epoxy, or the like. As long as communication radio waves can be transmitted and received, the fourth insulating layer 244 may be made of a material other than glass, glass epoxy, tetrafluoroethylene, epoxy, or the like.

In the phase shifter forming layer, the phase shifter 21 is formed for each patch antenna P. The phase shifter forming layer is formed on the upper surface of the substrate 220. The fourth insulating layer 244 is formed on the upper surface of the phase shifter forming layer. Two types of openings (slot $S_1$, slot $S_2$) are formed in the second ground layer 252 above phase shifter 21. The signal line $L_{s1}$ is disposed above the phase shifter 21 via the slot $S_1$. The signal line $L_{s2}$ is disposed above the phase shifter 21 via the slot $S_2$. The signal propagated through the signal line $L_{s1}$ is propagated to the phase shifter 21 by the electromagnetic coupling EC via the slot $S_1$. The signal propagated to the phase shifter 21 is phase-shifted by the phase shift amount set in the phase shifter 21 and propagated to the signal line $L_{s2}$ by the electromagnetic coupling EC via the slot $S_2$.

The substrate 220 is disposed below the phase shifter forming layer. On the upper surface of the substrate 220, a matrix circuit, TFT wiring, and a phase shifter 21 are formed. The matrix circuit has a structure in which a plurality of thin-film transistors (TFT) are arranged in a two-dimensional array form. For example, the TFT included in the matrix circuit is formed using a TFT process technology. The TFT wiring includes a plurality of selection lines used to select a phase shifter 21 and a plurality of data lines used to write phase shift data to the phase shifter 21. For example, a material of the substrate 220 is glass, glass epoxy, tetrafluoroethylene, epoxy, or the like. As long as communication radio waves can be transmitted and received, the substrate 220 may be made of a material other than glass, glass epoxy, tetrafluoroethylene, epoxy, or the like.

Figure 24:
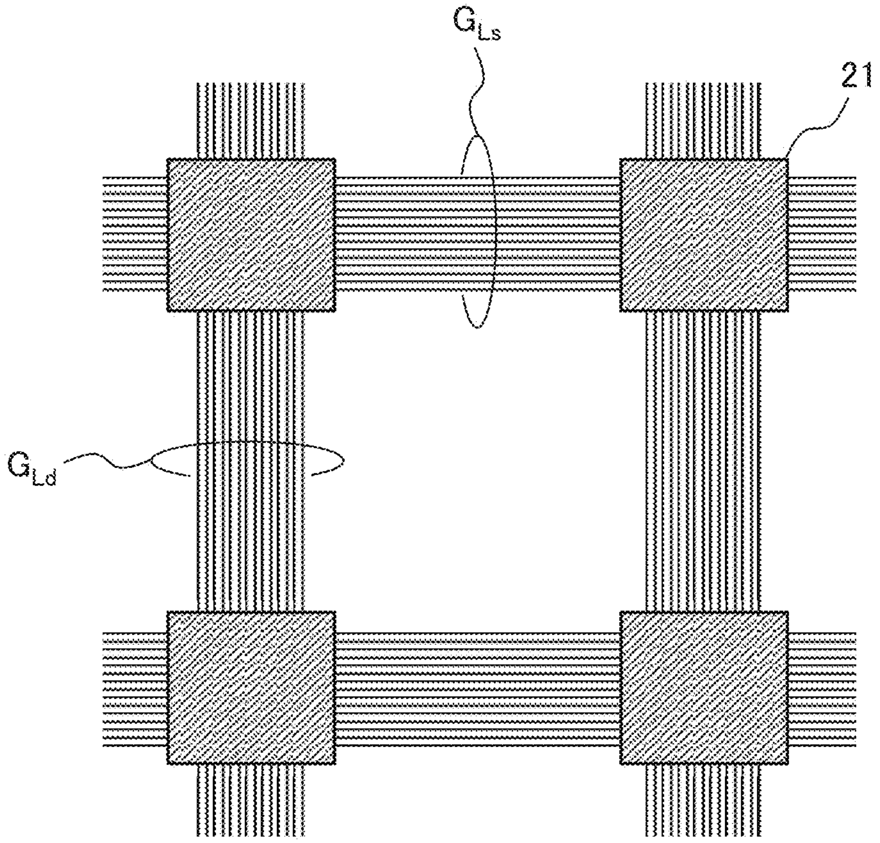
FIG. 24 is a conceptual diagram illustrating an example of a matrix circuit formed on an upper surface of a substrate according to the present disclosure.

FIG. 24 is a conceptual diagram illustrating an example of a matrix circuit formed on an upper surface of a substrate according to the present disclosure. FIG. 24 is a plan view of a surface on which the matrix circuit is formed as viewed from an upper viewpoint. TFT wiring is formed in the phase shifter forming layer. The TFT wiring includes a selection line group $G_{Ls}$ including a plurality of selection lines and a data line group $G_{Ld}$ including a plurality of data lines. Each of the plurality of selection lines included in the selection line group $G_{Ls}$ is used to select the phase shifter 21. Each of the plurality of data lines included in the data line group $G_{Ld}$ is used for propagation of a signal radiated via the phase shifter 21. The TFT wiring may include wiring other than the selection line group $G_{Ls}$ and the data line group $G_{Ld}$.

The third ground layer 253 is disposed on the lower surface of the substrate 220. The third ground layer 253 is made of a conductor. For example, a material of the third ground layer 253 is metal (including alloy) such as copper, aluminum, and chromium. The potential of the third ground layer 253 is a ground potential. Therefore, a capacitance corresponding to the dielectric constant of the substrate 220 is formed between the phase shifter 21 and the third ground layer 253.

A signal supplied from a signal source (not illustrated) to the signal line $L_{s1}$ is propagated to the phase shifter 21 by electromagnetic coupling via the slot $S_1$. The signal propagated to phase shifter 21 is phase-shifted according to the phase shift amount set in phase shifter 21. The phase-shifted signal is propagated to the signal line $L_{s2}$ from the phase shifter 21 by electromagnetic coupling via the slot $S_2$. The signal phase-shifted by the phase shifter 21 is propagated through the signal line $L_{s2}$ and reaches below the patch antenna P. The signal that has reached below the patch antenna P is propagated from the signal line $L_{s2}$ to the patch antenna P by electromagnetic coupling via the slot $S_0$. The signal propagated to the patch antenna P is transmitted as a radio signal from the phased array antenna configured by the plurality of patch antennas P.

Figure 25:
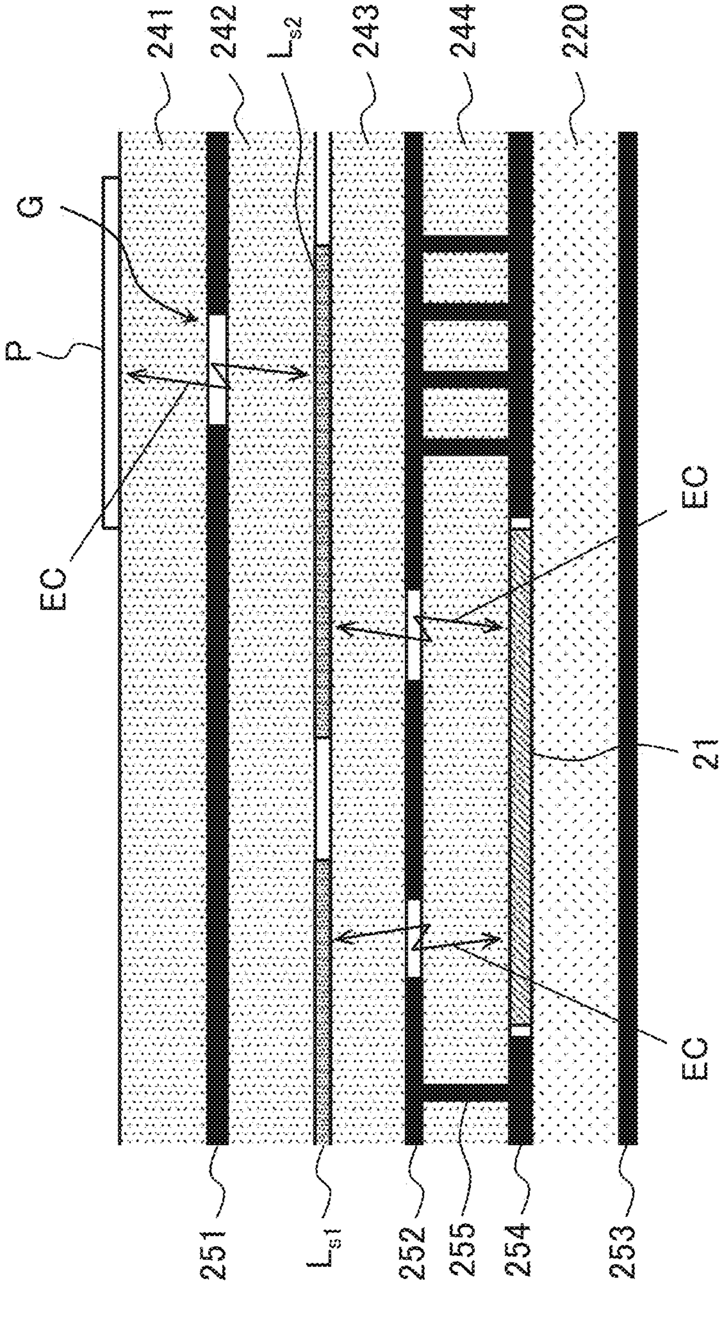
FIG. 25 is a conceptual diagram illustrating an example of a configuration of the antenna device according to the present disclosure.

FIG. 25 is a conceptual diagram illustrating an example of a configuration of the antenna device according to the present disclosure. The antenna device illustrated in FIG. 25 is different from the antenna device illustrated in FIG. 23 in that a fourth ground layer is formed on the same layer as the phase shifter forming layer. The fourth ground layer 254 is electrically connected to third ground layer 253 by a plurality of vias 255 penetrating fourth insulating layer 244. The plurality of vias 255 are formed inside the through hole penetrating the fourth insulating layer 244. The fourth ground layer 254 is grounded to the same potential as the third ground layer 253 by the plurality of vias 255. As compared with the configuration of FIG. 23, the configuration of FIG. 25 can be more reliably grounded inside the antenna device.

Figure 26:
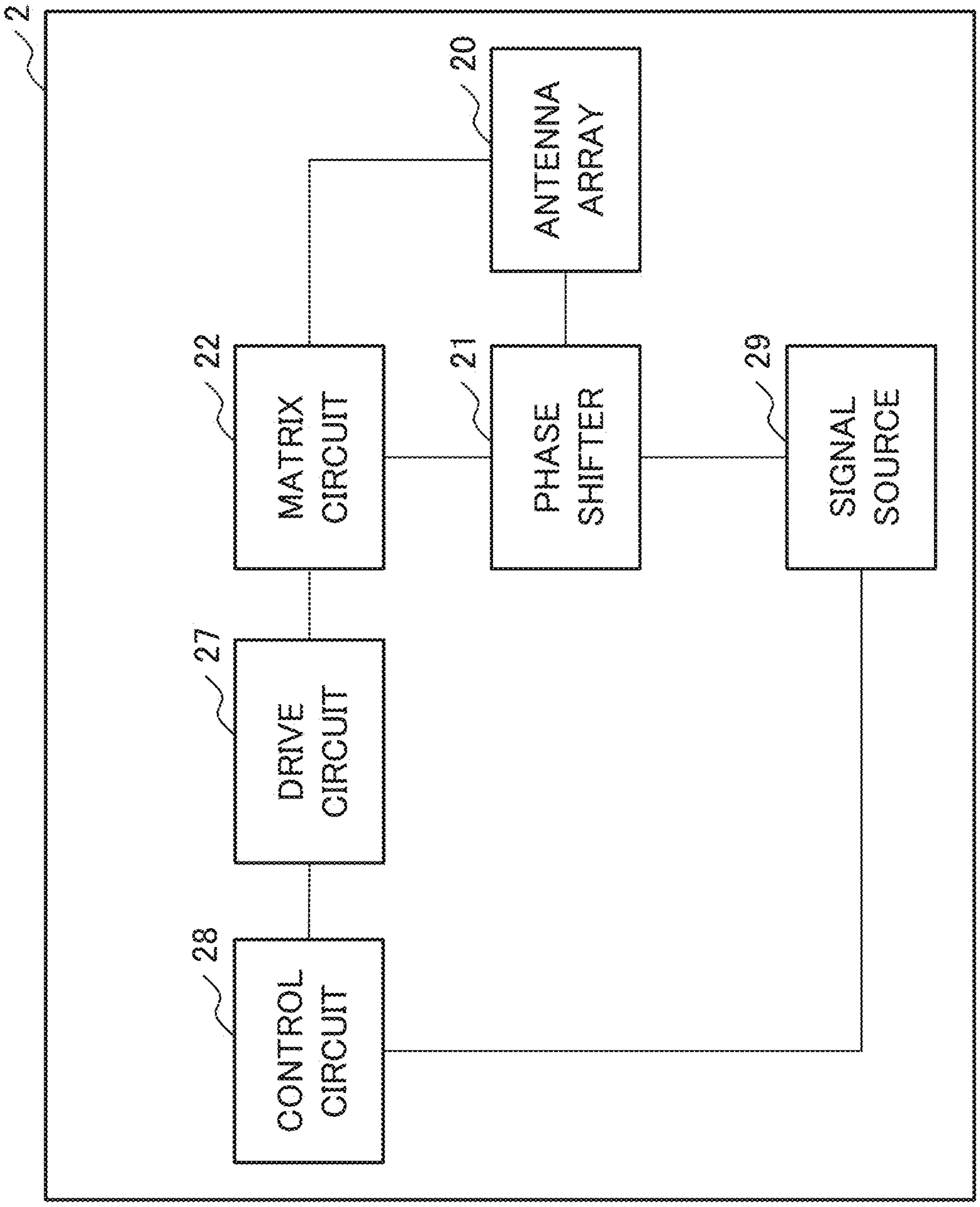
FIG. 26 is a block diagram illustrating an example of a functional configuration of the antenna device according to the present disclosure.

FIG. 26 is a block diagram illustrating an example of a functional configuration of the antenna device according to the present disclosure. The antenna device 2 includes an antenna array 20, a phase shifter 21, a matrix circuit 22, a control circuit 28, and a signal source 29.

The matrix circuit 22 has a configuration in which a plurality of thin-film transistors (TFT) are arrayed in a two-dimensional array form. The matrix circuit 22 is formed using a TFT process technology. Each of the plurality of TFTs included in the matrix circuit 22 is associated with one of the plurality of patch antennas P included in the antenna array 20. For example, the TFT includes a semiconductor layer such as amorphous silicon or polysilicon. Each of the plurality of pixels formed in the matrix circuit 22 is associated with the patch antenna P.

The phase shifter 21 is disposed for each antenna unit. The phase shifter 21 is the phase shifter 10 according to the first example embodiment. The phase shifter 21 is associated with the patch antenna P. The heat generation drive circuit (not illustrated) included in the phase shifter 21 is associated with each of the plurality of pixels formed in the matrix circuit 22. The heat generating element (not illustrated) included in the phase shifter 21 generates heat in accordance with selection of the heat generation drive circuit. A conductor pattern corresponding to a desired phase shift amount is set in a varactor (not illustrated) included in the phase shifter 21. The capacitance of the varactor is adjusted according to the set conductor pattern. As a result, a phase shift amount corresponding to the capacitance of the varactor is set in the phase shifter 21.

The drive circuit 27 includes a first drive circuit 271 and a second drive circuit 272. The first drive circuit 271 is a circuit for performing addressing in the X direction. The second drive circuit 272 is a circuit for performing addressing in the Y direction. The drive circuit 27 drives the TFTs included in the matrix circuit 22 under the control of the control circuit 28. The drive circuit 27 individually drives the plurality of TFTs included in the matrix circuit 22.

The control circuit 28 drives the drive circuit 27 according to an external control signal. The control circuit 28 drives the drive circuit 27 by an active matrix drive system. The control circuit 28 drives the first drive circuit 271 and the second drive circuit 272 in conjunction with each other to designate an address associated with each patch antenna P. In addition, the control circuit 28 outputs a control signal from the outside to the signal source 29.

For example, the control circuit 28 is achieved by a microcomputer or a microcontroller. For example, the control circuit 28 includes a Central Processing Unit (CPU), a Random Access Memory (RAM), a Read Only Memory (ROM), a flash memory, and the like. The control circuit 28 executes control and process corresponding to a program stored in advance. The control circuit 28 executes control and process corresponding to a program according to a preset schedule and timing, an external control instruction, and the like. For example, the control circuit 28 controls the antenna array 20 including the plurality of patch antennas P included in the planar antenna 200 to transmit a radio wave having directivity from the antenna array 20. As described above, the antenna array 20 is used as a phased array antenna.

The signal source 29 is connected to the phase shifter 21 via a signal line. In addition, the signal source 29 is connected to the control circuit 28. The signal source 29 transmits a signal to the phase shifter 21 under the control of the control circuit 28. The signal source 29 may be configured to receive a signal from the outside without passing through the control circuit 28.

The signal reaching the signal input unit of the phase shifter 21 through the signal line (not illustrated) connected to the TFT in the ON state is phase-shifted by the phase shift amount set in the phase shifter 21. The phase-shifted signal is propagated from the signal line to the patch antenna P by electromagnetic coupling. The radio wave derived from the signal propagated to the patch antenna P is transmitted from the patch antenna P. Furthermore, the radio wave transmitted from the patch antenna P is based on a signal output from a transmission circuit (not illustrated). The information included in the signal is not particularly limited.

In addition, the radio wave received by the patch antenna P is received according to the capacitance based on the dielectric constant of the dielectric such as the insulating layer or the TFT substrate interposed between the patch antenna P and the signal line. The phase of the received radio wave is phase-shifted by the phase shift amount set in phase shifter 21. The phase-shifted signal is received by a reception circuit (not illustrated) through the signal line. Information included in the signal received by the reception circuit is decoded by a decoder (not illustrated).

As described above, the antenna device according to the present example embodiment includes the phase shifter according to the first example embodiment and the antenna array in which a plurality of patch antennas are arranged in a two-dimensional array form. The phase shifter is arranged in association with each of the plurality of patch antennas.

The antenna device of the present example embodiment includes a phase shifter having a variable capacitance layer made of vanadium dioxide. By performing a temperature control, a conductor pattern corresponding to the phase transition of the insulating phase-metal phase of vanadium dioxide is formed in the variable capacitance layer. A continuous phase shift amount can be stably set in the variable capacitance layer by controlling the size and shape of the conductor pattern to be formed. In the plurality of phase shifters included in the antenna device of the present example embodiment, a continuous phase shift change is achieved with a stable phase shift amount. An optional phase shift amount can be set for each of the plurality of patch antennas. Therefore, according to the antenna device of the present example embodiment, a phased array antenna capable of transmitting a radio wave having directivity in an optional direction can be achieved.

Third Example Embodiment

Next, a phase shifter according to a third example embodiment will be described with reference to the drawings. The phase shifter of the present example embodiment has a configuration obtained by simplifying the phase shifter of the first example embodiment.

Figure 27:
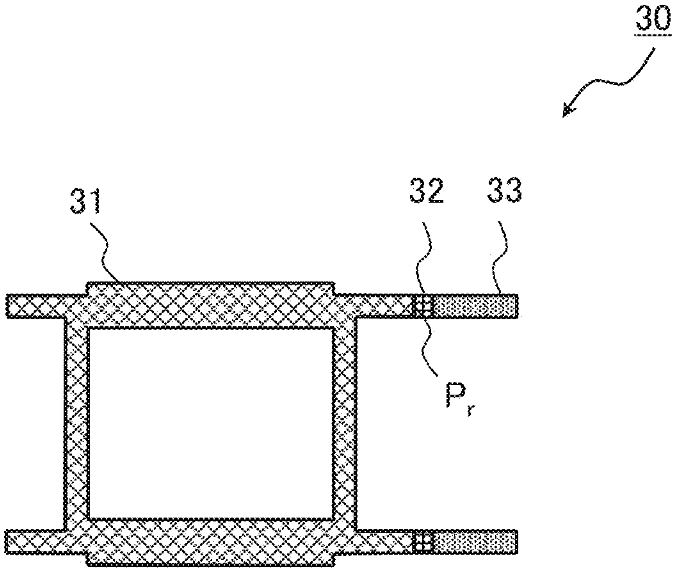
FIG. 27 is a conceptual diagram illustrating an example of a configuration of a phase shifter according to the present disclosure.

FIG. 27 is a conceptual diagram illustrating an example of a configuration of a phase shifter according to the present disclosure. The phase shifter 30 includes a 90 degree hybrid circuit 31, a varactor 32, and a stub 33.

The 90 degree hybrid circuit 31 has two reflection ends. FIG. 27 illustrates a 90 degree hybrid circuit as the 90 degree hybrid circuit 31, but the 90 degree hybrid circuit 31 is not limited to the 90 degree hybrid circuit. The varactor 32 has a variable capacitance layer made of vanadium dioxide. The varactor 32 is disposed at a reflection end $P_r$ of the 90 degree hybrid circuit. The stub 33 is connected to the reflection end $P_r$ of the 90 degree hybrid circuit 31 by way of the varactor 32.

The phase shifter of the present example embodiment includes a variable capacitance layer made of vanadium dioxide. By performing a temperature control, a conductor pattern corresponding to the phase transition of the insulating phase-metal phase of vanadium dioxide is formed in the variable capacitance layer. A continuous phase shift amount can be stably set in the variable capacitance layer by controlling the size and shape of the conductor pattern to be formed. Therefore, according to the phase shifter of the present example embodiment, a continuous phase shift change can be achieved with a stable phase shift amount.

Hardware

Next, a hardware configuration for executing control and process in the present disclosure will be described with reference to the drawings. Here, an example of such a hardware configuration is the information processing device 90 (computer) in FIG. 28. The information processing device 90 in FIG. 28 is a configuration example for executing control and process in the present disclosure, and does not limit the scope of the present disclosure.

Figure 28:
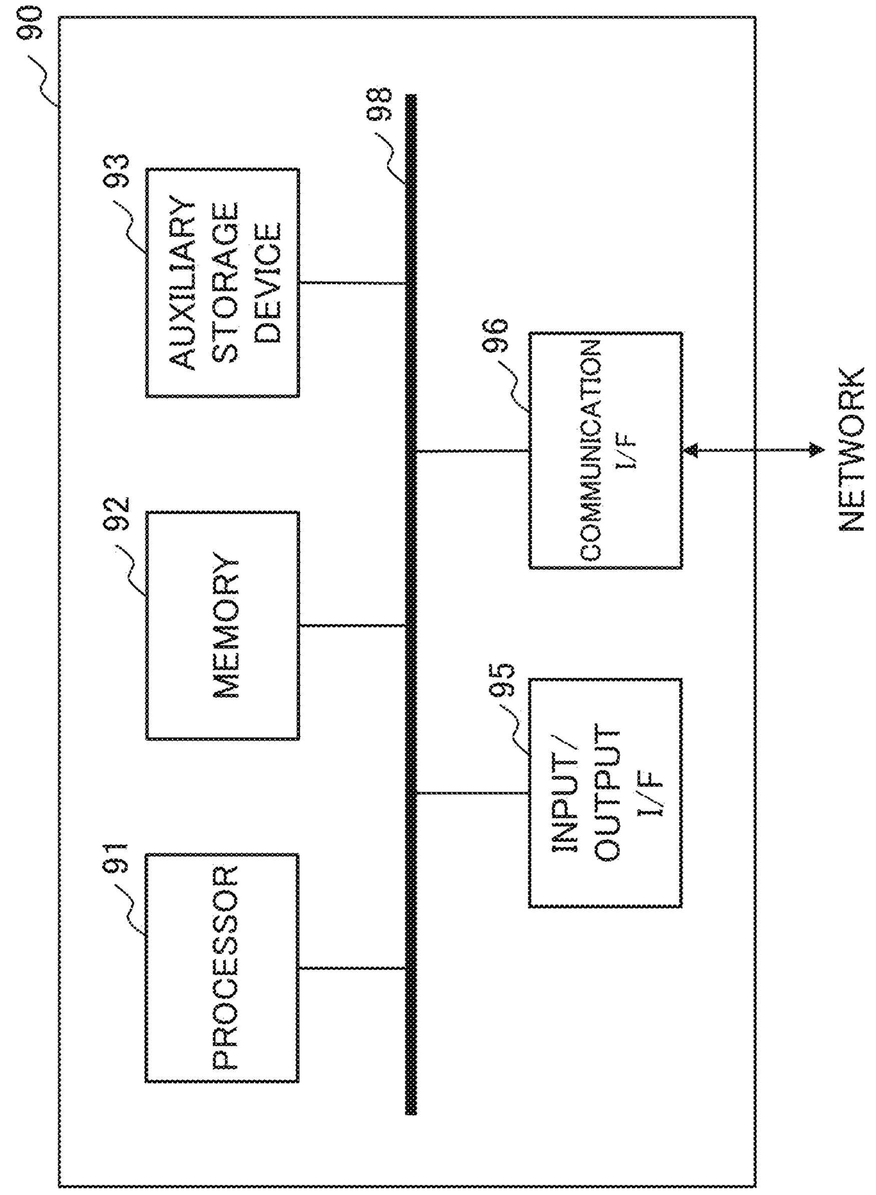
FIG. 28 is a block diagram illustrating an example of a hardware configuration that executes control according to the present disclosure.

As illustrated in FIG. 28, the information processing device 90 includes a processor 91, a memory 92, an auxiliary storage device 93, an input/output interface 95, and a communication interface 96. In FIG. 28, the interface is abbreviated as an interface (I/F). The processor 91, the memory 92, the auxiliary storage device 93, the input/output interface 95, and the communication interface 96 are connected to each other via a bus 98 in such a way as to be able to communicate data. In addition, the processor 91, the memory 92, the auxiliary storage device 93, and the input/output interface 95 are connected to a network such as the Internet or an intranet via the communication interface 96.

The processor 91 develops a program (command) stored in the auxiliary storage device 93 or the like in the memory 92. For example, the program is a software program for executing control and process in the present disclosure. The processor 91 executes the program developed in the memory 92. The processor 91 executes control and process in the present disclosure by executing a program.

The memory 92 is a storage device having an area in which a program is developed. A program stored in the auxiliary storage device 93 or the like is developed in the memory 92 by the processor 91. The memory 92 is achieved by, for example, a volatile memory such as a Dynamic Random Access Memory (DRAM). In addition, a nonvolatile memory such as a Magnetoresistive Random Access Memory (MRAM) may be applied as the memory 92.

The auxiliary storage device 93 stores various data such as programs. For example, the auxiliary storage device 93 is achieved by a local disk such as a hard disk or a flash memory. Various data may be stored in the memory 92, and the auxiliary storage device 93 may be omitted.

The input/output interface 95 is an interface for connecting the information processing device 90 and a peripheral device based on a standard or a specification. The communication interface 96 is an interface for connecting to an external system or device through a network such as the Internet or an intranet based on a standard or a specification. The input/output interface 95 and the communication interface 96 may be shared as an interface to connect to an external device.

Input devices such as a keyboard, a mouse, and a touch panel may be connected to the information processing device 90 as necessary. These input devices are used to input information and settings. When a touch panel is used as the input device, a screen having a touch panel function serves as an interface. The processor 91 and the input device are connected via the input/output interface 95.

The information processing device 90 may be provided with a display device for displaying information. In a case where a display device is provided, the information processing device 90 includes a display control device (not illustrated) for controlling display of the display device. The information processing device 90 and the display device are connected via the input/output interface 95.

The information processing device 90 may be provided with a drive device. The drive device mediates reading of data and a program stored in a recording medium and writing of a processing result of the information processing device 90 to the recording medium between the processor 91 and the recording medium (program recording medium). The information processing device 90 and the drive device are connected via an input/output interface 95.

The above is an example of a hardware configuration for enabling control and process in the present disclosure. The hardware configuration of FIG. 28 is an example of a hardware configuration for executing control and process in the present disclosure, and does not limit the scope of the present disclosure. A program for causing a computer to execute control and process in the present disclosure is also included in the scope of the present disclosure.

A program recording medium on which a program for executing process in the present example embodiment is recorded is also included in the scope of the present disclosure. For example, the program recording medium is a computer-readable non-transitory recording medium. The recording medium can be achieved by, for example, an optical recording medium such as a compact disc (CD) or a digital versatile disc (DVD). The recording medium may be achieved by a semiconductor recording medium such as a universal serial bus (USB) memory or a secure digital (SD) card. Furthermore, the recording medium may be achieved by a magnetic recording medium such as a flexible disk, or another recording medium.

The components in the present disclosure may be optionally combined. The components in the present disclosure may be implemented by software. The components in the present disclosure may be implemented by a circuit.

The previous description of embodiments is provided to enable a person skilled in the art to make and use the present invention. Moreover, various modifications to these example embodiments will be readily apparent to those skilled in the art, and the generic principles and specific examples defined herein may be applied to other embodiments without the use of inventive faculty. Therefore, the present invention is not intended to be limited to the example embodiments described herein but is to be accorded the widest scope as defined by the limitations of the claims and equivalents.

Further, it is noted that the inventor's intent is to retain all equivalents of the claimed invention even if the claims are amended during prosecution.

Some or all the above example embodiments may be described as the following supplementary notes, but are not limited to the following.

Supplementary Note 1

A phase shifter comprising:

a 90 degree hybrid circuit having two reflection ends, a varactor having a variable capacitance layer made of vanadium dioxide and disposed at the reflection end of the 90 degree hybrid circuit, and a stub connected to the reflection end of the 90 degree hybrid circuit via the varactor.

Supplementary Note 2

The phase shifter according to supplementary note 1, wherein the varactor includes:

a plurality of heat generating elements arranged in an array form along one surface of the variable capacitance layer, and a heat generation drive circuit arranged in association with each of the plurality of heat generating elements, each of the plurality of heat generating elements is thermally connected to the variable capacitance layer, and each of the plurality of heat generation drive circuits causes the heat generating element to generate heat to a temperature exceeding a phase transition temperature of vanadium dioxide contained in the variable capacitance layer according to selection of the heat generating element.

Supplementary Note 3

The phase shifter according to supplementary note 2, wherein a conductor pattern is formed in the variable capacitance layer by heat generation according to selection of the plurality of heat generating elements, and a capacitance corresponding to a conductor pattern formed in the variable capacitance layer is formed in the varactor.

Supplementary Note 4

The phase shifter according to supplementary note 3, wherein the conductor pattern extended in a quadrangular shape according to a capacitance of the varactor equivalent to a desired phase shift amount is formed from the reflection end toward the stub in the variable capacitance layer.

Supplementary Note 5

The phase shifter according to supplementary note 3, wherein the conductor pattern having an optional shape is formed from the reflection end toward the stub in the variable capacitance layer according to a capacitance of the varactor equivalent to a desired phase shift amount.

Supplementary Note 6

The phase shifter according to supplementary note 3, wherein the heat generation drive circuit that causes the heat generating element used for forming the conductor pattern corresponding to a desired phase shift amount to generate heat is selected using a phase shift table in which the conductor pattern corresponding to the phase shift amount is registered, and the conductor pattern corresponding to the conductor pattern set using the phase shift table is formed in the variable capacitance layer.

Supplementary Note 7

The phase shifter according to supplementary note 6, wherein one varactor is arranged in each of the two reflection ends included in the 90 degree hybrid circuit, and one stub is disposed in each of the two varactors.

Supplementary Note 8

The phase shifter according to supplementary note 7, wherein the stub is a short stub.

Supplementary Note 9

The phase shifter according to supplementary note 3, wherein the varactor includes a connection electrode for electrically connecting the reflection end of the 90 degree hybrid circuit and the variable capacitance layer, a capacitance formation layer serving as an insulating layer formed on an upper surface of the variable capacitance layer, and an upper electrode formed on an upper surface of the capacitance formation layer and configured to electrically connect the variable capacitance layer and the stub via a contact hole.

Supplementary Note 10

An antenna device comprising:

the phase shifter according to any one of supplementary notes 1 to 9, and an antenna array in which a plurality of patch antennas are arrayed in a two-dimensional array form, wherein the phase shifter is disposed in association with each of the plurality of patch antennas.

The invention claimed is:

1. A phase shifter comprising:

a 90 degree hybrid circuit having two reflection ends;

a varactor having a variable capacitance layer made of vanadium dioxide and disposed at each of the two reflection ends of the 90 degree hybrid circuit; and a stub connected to each of the two reflection ends of the 90 degree hybrid circuit via the varactor, wherein the varactor includes:

a plurality of heat generating elements arranged in an array form along one surface of the variable capacitance layer, and a heat generation drive circuit arranged in association with each of the plurality of heat generating elements;

each of the plurality of heat generating elements is thermally connected to the variable capacitance layer; and each of the plurality of heat generation drive circuits is configured to cause the heat generating element to generate heat to a temperature exceeding a phase transition temperature of vanadium dioxide contained in the variable capacitance layer according to selection of the heat generating element.

2. The phase shifter according to claim 1, wherein a conductor pattern is formed in the variable capacitance layer by heat generation according to selection of the plurality of heat generating elements, and a capacitance corresponding to a conductor pattern formed in the variable capacitance layer is formed in the varactor.

3. The phase shifter according to claim 2, wherein the heat generation drive circuit that causes the heat generating element used for forming the conductor pattern corresponding to a desired phase shift amount to generate heat is selected using a phase shift table in which the conductor pattern corresponding to the phase shift amount is registered, and the conductor pattern corresponding to the conductor pattern set using the phase shift table is formed in the variable capacitance layer.

4. The phase shifter according to claim 3, wherein the varactor is arranged in each of the two reflection ends included in the 90 degree hybrid circuit, and one stub is disposed in each of the two varactors.

5. The phase shifter according to claim 4, wherein the stub is a short stub.

6. The phase shifter according to claim 3, wherein the conductor pattern extended in a quadrangular shape according to a capacitance of the varactor equivalent to a desired phase shift amount is formed from each of the two reflection ends toward the stub in the variable capacitance layer.

7. The phase shifter according to claim 3, wherein the conductor pattern having an optional shape is formed from each of the two reflection ends toward the stub in the variable capacitance layer according to a capacitance of the varactor equivalent to a desired phase shift amount.

8. The phase shifter according to claim 3, wherein the varactor includes a connection electrode for electrically connecting each of the two reflection ends of the 90 degree hybrid circuit and the variable capacitance layer, a capacitance formation layer serving as an insulating layer formed on an upper surface of the variable capacitance layer, and an upper electrode formed on an upper surface of the capacitance formation layer and configured to electrically connect the variable capacitance layer and the stub via a contact hole.

9. An antenna device comprising:

the phase shifter according to claim 1; and an antenna array in which a plurality of patch antennas are arrayed in a two-dimensional array form; wherein the phase shifter is disposed in association with each of the plurality of patch antennas.

* * * * *